(12) United States Patent
Harada

(10) Patent No.: US 6,906,420 B2
(45) Date of Patent: *Jun. 14, 2005

(54) SEMICONDUCTOR DEVICE

(75) Inventor: Takeshi Harada, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/737,911

(22) Filed: Dec. 18, 2003

(65) Prior Publication Data

US 2004/0124532 A1 Jul. 1, 2004

Related U.S. Application Data

(62) Division of application No. 09/884,135, filed on Jun. 20, 2001, now Pat. No. 6,683,381, which is a division of application No. 09/321,713, filed on May 28, 1999, now Pat. No. 6,475,912.

(30) Foreign Application Priority Data

| Jun. 1, 1998 | (JP) | ............................................ | 10-150956 |
| Aug. 4, 1998 | (JP) | ............................................ | 10-220330 |
| Jan. 21, 1999 | (JP) | ............................................ | 11-012699 |

(51) Int. Cl.[7] ............................................ H01L 23/48
(52) U.S. Cl. .................. 257/754; 257/751; 257/757; 257/763; 257/764; 257/765; 257/766; 257/767; 257/768; 257/770; 438/652; 438/683
(58) Field of Search ................................ 257/751, 754, 257/757, 763–768, 770

(56) References Cited

U.S. PATENT DOCUMENTS

| 5,045,345 A | 9/1991 | Singer |
| 5,136,362 A | 8/1992 | Grief et al. |
| 5,462,895 A | 10/1995 | Chen |

(Continued)

FOREIGN PATENT DOCUMENTS

| JP | 63-230877 | 9/1988 |
| JP | 03-132022 | 6/1991 |
| JP | 04-267359 | 9/1992 |
| JP | 07-235530 | 9/1995 |

(Continued)

OTHER PUBLICATIONS

Wolf, "Silicon Processing for the VLSI Era", pp. 132, 1990, Lattice Press, vol. 2, Process Integration.
Notice of Reasons for Rejection, Mailing No. 050671, Mailing Date: Feb. 27, 2001, Patent Application No. 11–012699, with English translation.
J.P. Lu et al., "A New Method for Processing Titanium Nitride Based Barrier Films Through Thermal Decomposition of Tdmat Combined with Post–Deposition Silane Anneal", pp. 269–275, 1997, Conference Proceedings ULSI XII Materials Research Society.
W.Y. Hsu et al., "A Process to Incorporate CVD TIN as Barriers for Quarter Micron Contacts with High Pressure Extruded Al Alloy", pp. 229–235, 1997, Conference Proceedings ULSI XII Materials Research Society.

Primary Examiner—George Eckert
Assistant Examiner—Matthew E. Warren
(74) Attorney, Agent, or Firm—Nixon Peabody LLP; Donald R. Studebaker

(57) ABSTRACT

The semiconductor device of the present invention includes: a substrate; a first conductor film supported by the substrate; an insulating film formed on the substrate to cover the first conductor film, an opening being formed in the insulating film; and a second conductor film, which is formed within the opening of the insulating film and is in electrical contact with the first conductor film. The second conductor film includes: a silicon-containing titanium nitride layer formed within the opening of the insulating film; and a metal layer formed over the silicon-containing titanium nitride layer. The metal layer is mainly composed of copper.

9 Claims, 38 Drawing Sheets

U.S. PATENT DOCUMENTS

| | | | |
|---|---|---|---|
| 5,627,102 A | | 5/1997 | Shinriki et al. |
| 5,763,953 A | | 6/1998 | Iijima et al. |
| 5,770,520 A | | 6/1998 | Zhao et al. |
| 5,899,724 A | | 5/1999 | Dobuzinsky et al. |
| 5,960,319 A | | 9/1999 | Iwata et al. |
| 5,968,333 A | | 10/1999 | Nogami et al. |
| 5,989,623 A | | 11/1999 | Chen et al. |
| 5,998,871 A | | 12/1999 | Urabe |
| 6,002,176 A | | 12/1999 | Nguyen et al. |
| 6,015,749 A | * | 1/2000 | Liu et al. .................... 438/628 |
| 6,048,788 A | | 4/2000 | Huang et al. |
| 6,054,191 A | * | 4/2000 | Sharan et al. ............... 427/534 |
| 6,057,231 A | | 5/2000 | Givens et al. |
| 6,066,557 A | | 5/2000 | Lukanc et al. |
| 6,069,073 A | | 5/2000 | Kim et al. |
| 6,077,772 A | | 6/2000 | Park et al. |
| 6,091,148 A | * | 7/2000 | Givens et al. ............... 257/750 |
| 6,091,152 A | | 7/2000 | Iwata |
| 6,096,597 A | | 8/2000 | Tsu et al. |
| 6,096,640 A | | 8/2000 | Hu |
| 6,096,646 A | | 8/2000 | Lee et al. |
| 6,100,184 A | | 8/2000 | Zhao et al. |
| 6,100,194 A | | 8/2000 | Chan et al. |
| 6,124,198 A | | 9/2000 | Moslehi |
| 6,136,682 A | | 10/2000 | Hegde et al. |
| 6,136,692 A | | 10/2000 | Urabe |
| 6,140,223 A | | 10/2000 | Kim et al. |
| 6,140,226 A | | 10/2000 | Grill et al. |
| 6,140,236 A | | 10/2000 | Restaino et al. |
| 6,146,959 A | | 11/2000 | DeBoer et al. |
| 6,147,000 A | | 11/2000 | You et al. |
| 6,156,644 A | * | 12/2000 | Ko et al. .................... 438/639 |
| 6,177,145 B1 | | 1/2001 | Derderian et al. |
| 6,194,313 B1 | | 2/2001 | Singh et al. |
| 6,204,179 B1 | | 3/2001 | McTeer |
| 6,207,222 B1 | | 3/2001 | Chen et al. |
| 6,211,066 B1 | | 4/2001 | Stumborg et al. |
| 6,225,213 B1 | | 5/2001 | Urabe |
| 6,306,265 B1 | * | 10/2001 | Fu et al. ................. 204/192.12 |
| 6,351,039 B1 | | 2/2002 | Jin et al. |
| 6,475,912 B1 | | 11/2002 | Harada |
| 6,624,517 B1 | * | 9/2003 | Sandhu et al. ............... 257/764 |

FOREIGN PATENT DOCUMENTS

| | | |
|---|---|---|
| JP | 08-139092 | 5/1996 |
| JP | 08-222568 | 8/1996 |
| JP | 08-246152 | 9/1996 |
| JP | 08-279511 | 10/1996 |
| JP | 09-260306 | 10/1997 |
| JP | 09-312291 | 12/1997 |
| JP | 10-144629 | 5/1998 |
| JP | 10-189491 | 7/1998 |

* cited by examiner

PRIOR ART

PRIOR ART

PRIOR ART

PRIOR ART

PRIOR ART

SEMICONDUCTOR DEVICE

BACKGROUND OF THE INVENTION

The present invention relates to a semiconductor device and method and apparatus for fabricating the same.

As the number of semiconductor devices integrated on a single chip has been steeply rising, the gap between adjacent interconnect layers has been drastically reduced, resulting in non-negligible increase in capacitance between these interconnect layers. In general, the larger a capacitance between interconnect layers, the lower the operating speed of a semiconductor device, because a line-to-line delay also increases accordingly. In order to prevent such decrease in the operating speed of semiconductor devices, various techniques of forming an interconnect layer with a low resistance using copper (Cu) have recently been suggested more and more often. Hereinafter, a conventional semiconductor device, including an interconnect layer of Cu., will be described with reference to FIGS. 25, 26, 27, 28, 29 and 30.

As shown in FIG. 30, this semiconductor device includes: a semiconductor substrate 1; a lower interconnect layer 2 formed on the surface of the semiconductor substrate 1; and a silicon dioxide ($SiO_2$) film 3 formed over the semiconductor substrate 1 to cover the lower interconnect layer 2. A trisilicon tetranitride ($Si_3N_4$) film 4 is deposited over the $SiO_2$ film 3, and another $SiO_2$ film 5 is deposited on the $Si_3N_4$ film 4. An interlevel dielectric film is made up of the $SiO_2$ film 3, $Si_3N_4$ film 4 and $SiO_2$ film 5. In this interlevel di-electric film, a through hole 6, reaching the lower interconnect layer 2, and an interconnection channel or trench 7, communicating with the through hole 6, are formed. An upper interconnect layer 13, which is in electrical contact with the lower interconnect layer 2 via the through hole 6, is formed within the interconnection channel 7.

The upper interconnect layer 13 includes: a titanium (Ti) film 8 covering the inner side faces and bottom of the through hole 6 and interconnection channel 7; a titanium nitride (TiN) film 9 deposited on the Ti film 8; a Cu film 10 deposited on the TiN film 9; and a Cu film 11 deposited on the Cu film 10. Alternatively, the upper interconnect layer 13 may include a tantalum nitride (TaN) film instead of the TiN film 9.

Such a semiconductor device may be fabricated in the following manner.

First, as shown in FIG. 25, the lower interconnect layer 2 is formed on the semiconductor substrate 1. Next, as shown in FIG. 26, the $SiO_2$ film 3, $Si_3N_4$ film 4 and $SiO_2$ film 5 are deposited in this order and alternately subjected to photolithography and dry etching twice. In this manner, the through hole 6 is formed inside the $SiO_2$ film 3 and $Si_3N_4$ film 4, and the interconnection channel 7 is formed inside the $SiO_2$ film 5. Then, as shown in FIG. 27, the bottom of the through hole 6 is cleaned by dry etching. And the Ti film 8 and the TiN film 9 are deposited in this order by physical vapor deposition (PVD) and chemical vapor deposition (CVD) processes, respectively.

Next, as shown in FIG. 28, the surface of the TiN film 9 is exposed to $N_2$ plasma, thereby increasing the density of the TiN film 9. As the case may be, this process step is sometimes omitted. Thereafter, as shown in FIG. 29, the Cu film 10 is deposited by a PVD process on the surface of the TiN film 9. However, the Cu film 10 is deposited only in the central region of the semiconductor substrate 1. The reason thereof will be described later.

After the surfaces of the TiN film 9 and Cu film 10 have been cleaned with sulfuric acid ($H_2SO_4$), the Cu film 11 is deposited on the surface of the Cu film 10 by an electroplating technique. Finally, respective portions of the Ti film 8, TiN film 9 and Cu films 10 and 11, which are deposited on the $SiO_2$ film 5, are removed by a chemical/mechanical polishing (CMP) technique to complete the semiconductor device shown in FIG. 30.

The reason why the Cu film 10 is deposited only in the central region of the semiconductor substrate 1 will be described. Generally speaking, it is only in the central region of a semiconductor substrate that a metal layer can be removed by a CMP technique. Thus, part of the metal layer is ordinarily left in the peripheral region of the semiconductor substrate even after the polishing. If the Cu film is left in the peripheral region of the semiconductor substrate 1, then the Cu film is likely to peel off during a subsequent process step to contaminate an apparatus for fabricating the semiconductor device. Accordingly, a technique of preventing to a residue of a Cu film from being formed in the peripheral region of a semiconductor substrate 1 by depositing the Cu film only in the central region of the semiconductor substrate 1 is widely used.

If a semiconductor device is fabricated in this manner, however, the following problems are caused.

First, when a TaN film 9 is deposited by a CVD process, the connection resistance between the lower and upper interconnect layers 2 and 13 becomes high and the operating speed of the semiconductor device may decrease, because the resistivity of the TaN film 9 is high. It is probably because a large quantity of carbon (C) is contained in the TaN film 9 that the resistivity of the TaN film 9 is high.

Also, Cu atoms contained in the Cu films 10 and 11 reach the $SiO_2$ films 3 and 5 through the TiN (or TaN) film 9. This is because the TiN (or TaN) film 9 cannot satisfactorily prevent the diffusion of the Cu atoms. The Cu atoms, which have reached the $SiO_2$ films 3 and 5, are turned into mobile ions inside these films 3 and 5, thereby increasing the leakage current flowing between the through holes 6 and between adjacent portions of the upper interconnect layer 13. As a result, the semiconductor device is more likely to cause some failure during the operation thereof.

In addition, as shown in FIG. 29, when the Cu film 11 is deposited by an electroplating technique, a Cu film 12 is unintentionally deposited on the surface of the TiN film 9 adjacent to the Cu film 10. The adhesion of the Cu film 12 to the underlying TiN film 9 is poor. And the Cu film 12 easily peels off during the CMP process, thus considerably decreasing the yield of semiconductor devices.

SUMMARY OF THE INVENTION

An object of the present invention is providing a semiconductor device and method and apparatus for fabricating the same, which cause neither operating failures nor decrease in yield even when an interconnect layer is made of Cu.

A semiconductor device according to the present invention includes: a substrate; a first conductor film supported by the substrate; an insulating film formed on the substrate to cover the first conductor film, an opening being formed in the insulating film; and a second conductor film, which is formed within the opening of the insulating film and is in electrical contact with the first conductor film. The second conductor film includes: a silicon-containing titanium nitride layer formed within the opening of the insulating film; and a metal layer formed over the silicon-containing titanium nitride layer and mainly composed of copper.

Another semiconductor device according to the present invention includes: a substrate; a first conductor film supported by the substrate; an insulating film formed on the substrate to cover the first conductor film, an opening being formed in the insulating film; and a second conductor film, which is formed within the opening of the insulating film and is in electrical contact with the first conductor film. The second conductor film includes: a silicon-containing titanium nitride layer formed within the opening of the insulating film; a silicon-containing metal layer formed on the silicon-containing titanium nitride layer; and a metal layer formed on the silicon-containing metal layer, the metal layer being mainly composed of copper.

A method for fabricating a semiconductor device according to the present invention includes the steps of: a) forming a first conductor film on a substrate; b) depositing an insulating film over the substrate to cover the first conductor film; c) forming an opening in the insulating film such that at least part of the opening reaches the first conductor film; and d) forming a second conductor film within the opening of the insulating film. The step d) includes the steps of: depositing a silicon-containing titanium nitride layer by a chemical vapor deposition process to cover the inner sidewall and bottom of the opening of the insulating film; bombarding the surface of the silicon-containing titanium nitride layer with ions; and depositing a metal layer on the surface of the silicon-containing titanium nitride layer.

Another method for fabricating a semiconductor device according to the present invention includes the steps of: a) forming a first conductor film on a substrate; b) depositing an insulating film over the substrate to cover the first conductor film; c) forming an opening in the insulating film such that at least part of the opening reaches the first conductor film; and d) forming a second conductor film within the opening of the insulating film. The step d) includes the steps of: depositing a titanium nitride layer by a chemical vapor deposition process to cover the inner sidewall and bottom of the opening of the insulating film; bombarding the surface of the titanium nitride layer with ions; exposing the surface of the titanium nitride layer to a silicide to form a silicon-containing titanium nitride layer; and depositing a metal layer on the surface of the silicon-containing titanium nitride layer.

Still another method for fabricating a semiconductor device according to the present invention includes the steps of: a) forming a first conductor film on a substrate; b) depositing an insulating film over the substrate to cover the first conductor film; c) forming an opening in the insulating film such that at least part of the opening reaches the first conductor film; and d) forming a second conductor film within the opening of the insulating film. The step d) includes the steps of: depositing a titanium nitride layer by a chemical vapor deposition process to cover the inner sidewall and bottom of the opening of the insulating film; bombarding the surface of the titanium nitride layer with ions; exposing the surface of the titanium nitride layer to a silicide to form a silicon-containing titanium nitride layer; exposing the surface of the silicon-containing titanium nitride layer to a silicide to form a silicon layer; and depositing a metal layer on the surface of the silicon layer.

An apparatus for fabricating a semiconductor device according to the present invention includes a chemical vapor deposition chamber and a power supply connected to the susceptor and the electrode. The chemical vapor deposition chamber includes: a vacuum chamber; a susceptor placed inside the vacuum chamber, a heating mechanism being provided in the susceptor; an exhaust port provided inside the vacuum chamber; an inlet port provided inside the vacuum chamber; and an electrode provided inside the vacuum chamber. A titanium-containing organic compound, a nitride and a silicide are introduced through the inlet port.

Still another semiconductor device according to the present invention includes: a substrate; a first conductor film supported by the substrate; an insulating film formed on the substrate to cover the first conductor film, an opening being formed in the insulating film; and a second conductor film, which is formed within the opening of the insulating film and is in electrical contact with the first conductor film. The second conductor film includes: a carbon-containing metal nitride layer formed within the opening of the insulating film; and a metal layer formed on the carbon-containing metal nitride layer. The concentration of carbon in a portion of the metal nitride layer, which is formed over the bottom of the opening of the insulating film, is lower than that of carbon in another portion of the metal nitride layer, which is formed over the inner sidewall of the opening.

Yet another semiconductor device according to the present invention includes: a substrate; a first conductor film supported by the substrate; an insulating film formed on the substrate to cover the first conductor film, an opening being formed in the insulating film; and a second conductor film, which is formed within the opening of the insulating film and is in electrical contact with the first conductor film. The second conductor film includes: a metal nitride layer formed within the opening of the insulating film; a metal nitride silicide layer formed on the metal nitride layer; and a metal layer formed on the metal nitride silicide layer.

Yet another method for fabricating a semiconductor device according to the present invention includes the steps of: a) forming a first conductor film on a substrate; b) depositing an insulating film over the substrate to cover the first conductor film; c) forming an opening in the insulating film such that at least part of the opening reaches the first conductor film; and d) forming a second conductor film within the opening of the insulating film. The step d) includes the steps of: depositing a carbon-containing metal nitride layer by a chemical vapor deposition process to cover the inner sidewall and bottom of the opening of the insulating film; bombarding the surface of the carbon-containing metal nitride layer with ions; and depositing a metal layer on the surface of the carbon-containing metal nitride layer.

Yet another method for fabricating a semiconductor device according to the present invention includes the steps of: a) forming a first conductor film on a substrate; b) depositing an insulating film over the substrate to cover the first conductor film; c) forming an opening in the insulating film such that at least part of the opening reaches the first conductor film; and d) forming a second conductor film within the opening of the insulating film. The step d) includes the steps of: depositing a metal nitride layer by a chemical vapor deposition process to cover the inner sidewall and the bottom of the opening of the insulating film; bombarding the surface of the metal nitride layer with ions; exposing the surface of the metal nitride layer to a silicide to form a metal nitride silicide layer; and depositing a metal layer on the surface of the metal nitride silicide layer.

In a semiconductor device of the present invention, the concentration of carbon contained in a metal nitride film deposited on the bottom of an opening is lower than that of carbon contained in a metal nitride film deposited on the sidewall of the opening. The lower the concentration of carbon contained, the lower the resistivity of the metal nitride. Thus, by adjusting the amount of carbon contained in a metal nitride film deposited on the bottom of an opening (e.g., a through hole), the connection resistance between the lower and upper interconnect layers can be reduced as compared with the prior art.

In another semiconductor device of the present invention, the sidewalls of the through hole and the interconnect layer are covered with a metal nitride silicide (e.g., silicon-containing titanium nitride) layer. The ability of the metal nitride silicide layer to prevent the diffusion of copper atoms is higher than that of a metal nitride layer. Accordingly, in the structure of the present invention, the concentration of copper atoms contained in the insulating layer can be lowered. As a result, the leakage current flowing between the through holes and between adjacent portions of the upper interconnect layer can be reduced as compared with the prior art.

BRIEF DESCRIPTION OF THE DRAWINGS

FIG. 9A illustrates the XPS spectra of Ti atoms (Ti2p) contained in the silicon-containing titanium nitride layer, which has been formed through the exposure to $SiH_4$; and FIG. 9B illustrates the XPS spectra of Ti atoms (Ti2p) contained in the titanium nitride layer, which has not been exposed to $SiH_4$.

FIG. 10A illustrates the XPS spectra of Si atoms (Si2p) contained in the silicon-containing titanium nitride layer, which has been formed through the exposure to $SiH_4$; and FIG. 10B illustrates the XPS spectra of Si atoms (Si2p) contained in the titanium nitride layer, which has not been exposed to $SiH_4$.

FIG. 12A illustrates the XPS spectra of Ti atoms (Ti2p) contained in the silicon-containing titanium nitride layer, which has been formed through the exposure to $SiH_4$; and FIG. 12B illustrates the XPS spectra of Ti atoms (Ti2p) contained in the titanium nitride layer, which has not been exposed to $SiH_4$.

FIG. 13A illustrates the XPS spectra of Si atoms (Si2p) contained in the silicon-containing titanium nitride layer, which has been formed through the exposure to $SiH_4$; and FIG. 13B illustrates the XPS spectra of Si atoms (Si2p) contained in the titanium nitride layer, which has not been exposed to $SiH_4$.

DESCRIPTION OF THE PREFERRED EMBODIMENTS

Hereinafter, preferred embodiments of the present invention will be described with reference to the accompanying drawings.

Embodiment 1

A first exemplary embodiment of the present invention will be described with reference to FIGS. 1, 2, 3, 4, 5, 6 and 7.

Figure 7:
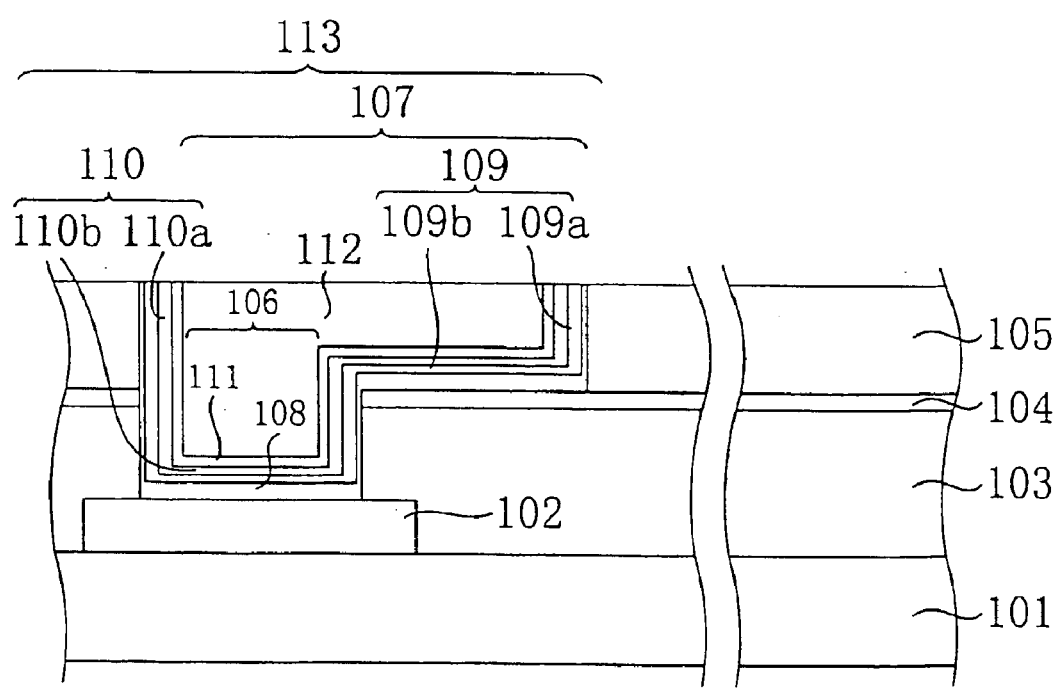
FIG. 7 is a cross-sectional view illustrating a first embodiment of a semiconductor device according to the present invention.

As shown in FIG. 7, the semiconductor device of the first embodiment includes: a semiconductor substrate (e.g., single crystalline silicon substrate) 101; a lower interconnect layer (or first conductive film) 102; and a silicon dioxide ($SiO_2$) film 103. On the semiconductor substrate 101, integrated circuit devices such as transistors are formed although not shown in FIG. 7. The lower interconnect layer 102 is formed on the surface of the semiconductor substrate 101. And the $SiO_2$ film 103 is deposited on the semiconductor substrate 101 to cover the lower interconnect layer 102. In this specification, the "semiconductor substrate 101", collectively refers to a single crystalline silicon substrate, integrated circuit devices such as transistors formed on the surface thereof, and an insulating film formed on surface of the single crystalline substrate to cover the integrated circuit devices. The lower interconnect layer 102 is made of a conductor such as tungsten (W), aluminum (Al) or copper (Cu).

A trisilicon tetranitride ($Si_3N_4$) film 104 is deposited over the $SiO_2$ film 103, and another $SiO_2$ film 105 is deposited on the $Si_3N_4$ film 104. An interlevel dielectric film is made up of the $SiO_2$ film 103, $Si_3N_4$ film 104 and $SiO_2$ film 105. In the surface of this interlevel dielectric film, an opening is formed. The opening includes a through hole 106, reaching the lower interconnect layer 102, and an interconnection channel, or trench 107, communicating with the through hole 106. An upper interconnect layer 113, which is in electrical contact with the lower interconnect layer 102 via the through hole 106, is formed within the interconnection channel 107. The width of the interconnection channel 107 is in the range from about 100 nm to about 2,000 nm, for example, and the depth thereof is in the range from about 100 nm to about 1,000 nm, for example. Also, in this embodiment, the inner diameter of the through hole 106 is set equal to the width of the interconnection channel 107. Although a single through hole 106 is illustrated in FIG. 7, a plurality of through holes 106 are actually formed in a single interconnection channel 107 at various intervals of about 0.1 μm to about 2 μm.

The upper interconnect layer 113 includes: a titanium (Ti) film 108 covering the inner side faces and bottom of the through hole 106 and interconnection channel 107; a titanium nitride (TiN) film 109 deposited on the Ti film 108; a silicon-containing TiN (TiSiN) film 110 formed on the TiN film 109; a Cu film 111 deposited on the surface of the TiSiN film 110; and another Cu film 112 deposited on the Cu film 111.

In this embodiment, the TiN film 109 will be regarded as including vertical portions 109a and horizontal portions 109b if necessary. The vertical portions 109a are formed on the inner sidewalls of the through hole 106 and interconnection channel 107, i.e., on respective planes substantially vertical to the surface of the semiconductor substrate 101. On the other hand, the horizontal portions 109b are formed on the bottoms of the through hole 106 and interconnection channel 107, i.e., on respective planes substantially parallel to the surface of the semiconductor substrate 101. In the same way, the TiSiN film 110 will also be regarded as including vertical portions 110a and horizontal portions 110b if necessary. The vertical portions 110a are also formed on the inner sidewalls of the through hole 106 and interconnection channel 107, i.e., on respective planes substantially vertical to the surface of the semiconductor substrate 101. On the other hand, the horizontal portions 110b are formed on the bottoms of the through hole 106 and interconnection channel 107, i.e., on respective planes substantially parallel to the surface of the semiconductor substrate 101.

It should be noted that the lower interconnect layer 102 is not necessarily the first-level interconnect layer, but may be an $i^{th}$-level interconnect layer of a multilevel interconnection structure including a number N of interconnect layers (where N is an integer equal to or larger than 3, i is also an integer and $1 \leq i \leq N$). In this case, the upper interconnect layer may be a $j^{th}$-level interconnect layer (where j is an integer and $1 < j \leq N$).

In such a structure, the leakage current flowing between the through holes 106 and between adjacent portions of the upper interconnect layer 113 can be reduced as compared with the prior art. The reason thereof is as follows.

In this embodiment, the sidewall of the interconnection channel 107 is covered with the TiSiN film 110. Silicon contained in the TiSiN film 110 is in the form of Si—N bonds. Since the Si—N bonds are much less likely to react with Cu atoms, the ability of the TiSiN film 110, including the Si—N bonds, to prevent the diffusion of Cu atoms is much higher than that of the TiN film. Accordingly, it is harder for the Cu atoms, contained in the Cu films 111 and 112, to reach the SiO$_2$ films 103 and 105. In other words, the concentration of Cu atoms in the SiO$_2$ films 103 and 105 hardly increases. As a result, the leakage current flowing between the through holes 106 and between adjacent portions of the upper interconnect layer 113 can be reduced as compared with the prior art.

The concentration of Si in the TiSiN film 110a will be described. If the concentration of Si in the TiSiN film 110a is less than 5 atomic percent, then the ability of the TiSiN film 110a to prevent the diffusion of the Cu atoms, which have been supplied from the Cu film 111, declines. As a result, an increased amount of leakage current flows between the through holes 106 and between adjacent portions of the upper interconnect layer 113. This is why the concentration of Si in the TiSiN film 110a is preferably 5 atomic percent or more.

Next, the thickness of the TiSiN film 110a will be described. If the TiSiN film 110a is thinner than 1 nm, then the ability of the TiSiN film 110a to prevent the diffusion of the Cu atoms, which have been supplied from the Cu film 111, declines. As a result, an increased amount of leakage current flows between the through holes 106 and between adjacent portions of the upper interconnect layer 113. On the other hand, if the TiSiN film 110a is thicker than 50 nm, then the percentage of the Cu films 111 and 112 accounting for the entire cross-sectional area of the upper interconnect layer 113 decreases. As a result, the line resistance of the upper interconnect layer 113 increases and the operating speed of the semiconductor device decreases. This is why the thickness of the TiSiN film 110a is preferably in the range from 1 nm to 50 nm, both inclusive.

Next, the thickness of the TiSiN film 110b will be described. The resistivity of the TiSiN film (i.e., about 3,000 μΩcm) is higher than that of the TiN film (i.e., about 200 μΩcm). Thus, if the TiSiN film 110b is too thick, then the connection resistance between the lower and upper interconnect layers 102 and 113 increases, thus decreasing the operating speed of the semiconductor device. This is why the TiSiN film 10b is preferably thinner than the TiSiN film 110a.

In this embodiment, the semiconductor device may be fabricated by the following process.

Figure 1:
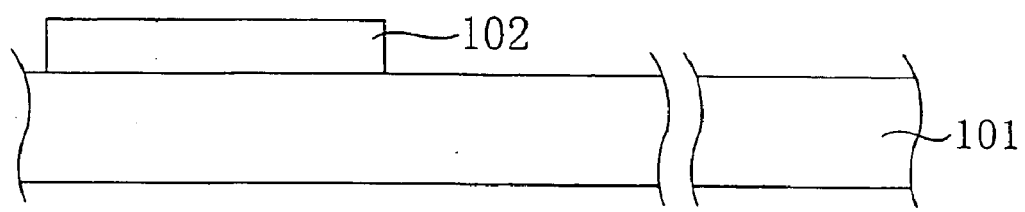
FIG. 1 is a cross-sectional view illustrating a first embodiment of a method for fabricating a semiconductor device according to the present invention.

First, as shown in FIG. 1, the semiconductor substrate 101, on which integrated circuit devices such as transistors (not shown) are formed, is prepared, and the lower interconnect layer 102 is formed on the semiconductor substrate 101. The lower interconnect layer 102 may be formed by depositing an Al film on the surface of the semiconductor substrate 101 by a sputtering technique, for example, and then patterning the Al film into a predetermined shape by photolithography and dry etching techniques.

Figure 2:
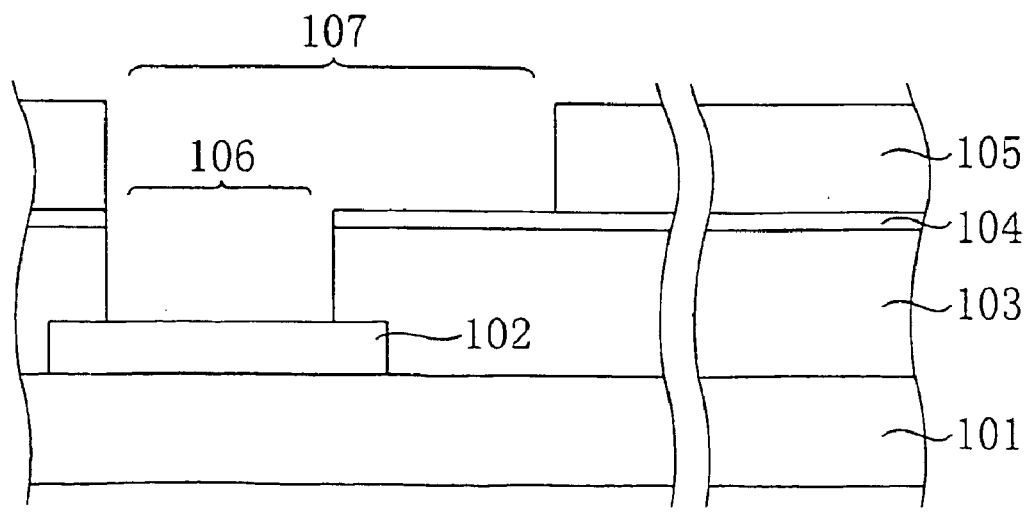
FIG. 2 is a cross-sectional view illustrating the first embodiment of the method for fabricating a semiconductor device according to the present invention.

Next, as shown in FIG. 2, the SiO$_2$ film (thickness: about 100 nm to about 2,000 nm) 103, Si$_3$N$_4$ film (thickness: about 5 nm to about 50 nm) 104 and SiO$_2$ film (thickness: about 100 nm to about 1,000 nm) 105 are deposited in this order by a plasma enhanced CVD process. Then, these films are alternately subjected to photolithography and dry etching twice, thereby forming the through hole 106 inside the SiO$_2$ film 103 and Si$_3$N$_4$ film 104 and the interconnection channel 107 inside the SiO$_2$ film 105.

Figure 3:
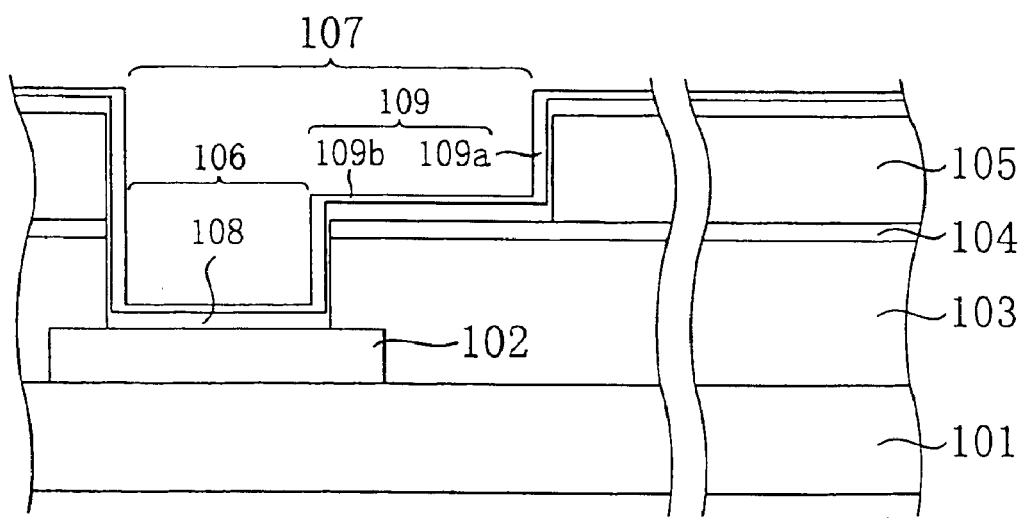
FIG. 3 is a cross-sectional view illustrating the first embodiment of the method for fabricating a semiconductor device according to the present invention.

Next, as shown in FIG. 3, the bottom of the through hole 106 is cleaned by dry etching using argon (Ar) and hydrogen (H$_2$) gases. Then, the Ti film (thickness: about 0.5 nm to about 10 nm) 108 is deposited by a physical vapor deposition (PVD) process and the TiN film 109 is deposited to be 20 nm thick by a chemical vapor deposition (CVD) process. The TiN film 109 may be deposited by the CVD process in the following manner. The semiconductor substrate 101, on which the Ti film 108 has already been deposited, is heated to 350° C. within a vacuum chamber. When the semiconductor substrate 101 reaches its steady temperature, tetrakisdimethyl titanium (TDMAT), diluted with helium (He), is introduced into the vacuum chamber. In this case, the amount of TDMAT introduced is adjusted at such a value that the partial pressure of TDMAT inside the vacuum chamber becomes 3 Pa. The TDMAT introduced is thermally decomposed on the surface of the Ti film 108. As a result, the TiN film 109 is deposited thereon.

Figure 4:
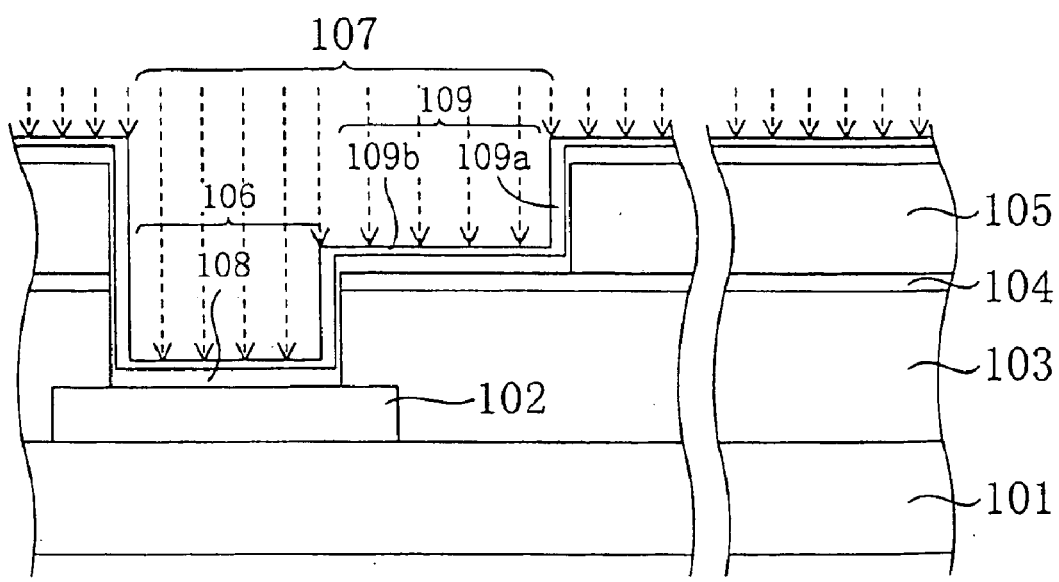
FIG. 4 is a cross-sectional view illustrating the first embodiment of the method for fabricating a semiconductor device according to the present invention.

Subsequently, as shown in FIG. 4, the surface of the TiN film 109 is exposed to nitrogen ($N_2$) plasma, in which positive ions such as $N_2$ ions are contained. The plasma is generated under the conditions controlled to vertically accelerate these positive ions toward the semiconductor substrate 101. Accordingly, the TiN film 109b deposited on the plane parallel to the surface of the semiconductor substrate 101 receives the impact of ion collision. As a result, the density of the TiN film 109 increases. On the other hand, since the TiN film 109a deposited on the planes substantially vertical to the surface of the semiconductor substrate 101 does not receive the impact of ion collision, the density thereof does not increase. The plasma exposure may be carried out using a parallel plate plasma generator, for example, under the conditions that pressure of the $N_2$ gas inside the chamber is in the range from about 10 Pa to about 1,000 Pa and power applied is in the range from about 200 W to about 2,000 W.

Figure 5:
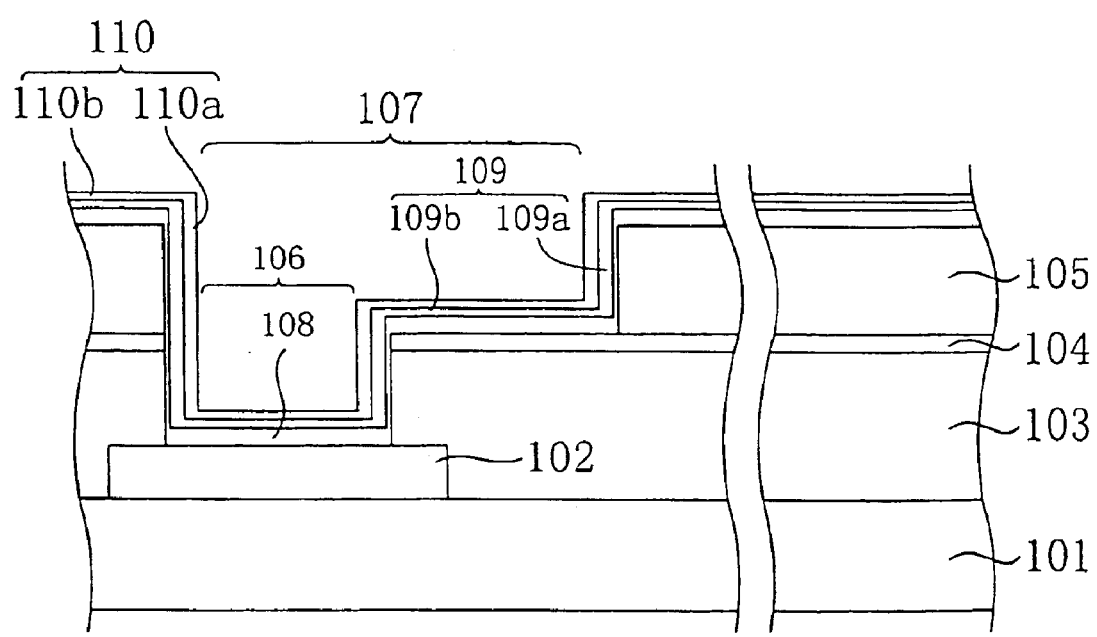
FIG. 5 is a cross-sectional view illustrating the first embodiment of the method for fabricating a semiconductor device according to the present invention.

Then, as shown in FIG. 5, the surface of the TiN film 109 is exposed to silane ($SiH_4$) gas. This process is performed with the semiconductor substrate 101, which has already been exposed to the $N_2$ plasma, heated within the vacuum chamber and with the $SiH_4$ gas introduced into the vacuum chamber. In this case, the amount of the $SiH_4$ gas introduced is adjusted at such a value that the partial pressure of the $SiH_4$ gas inside the vacuum chamber becomes 3 Pa. As a result, the TiSiN films 110a and 110b are formed on the TiN films 109a and 109b, respectively. As will be described in detail later, the TiSiN film 110b becomes thinner than the TiSiN film 110a.

Figure 6:
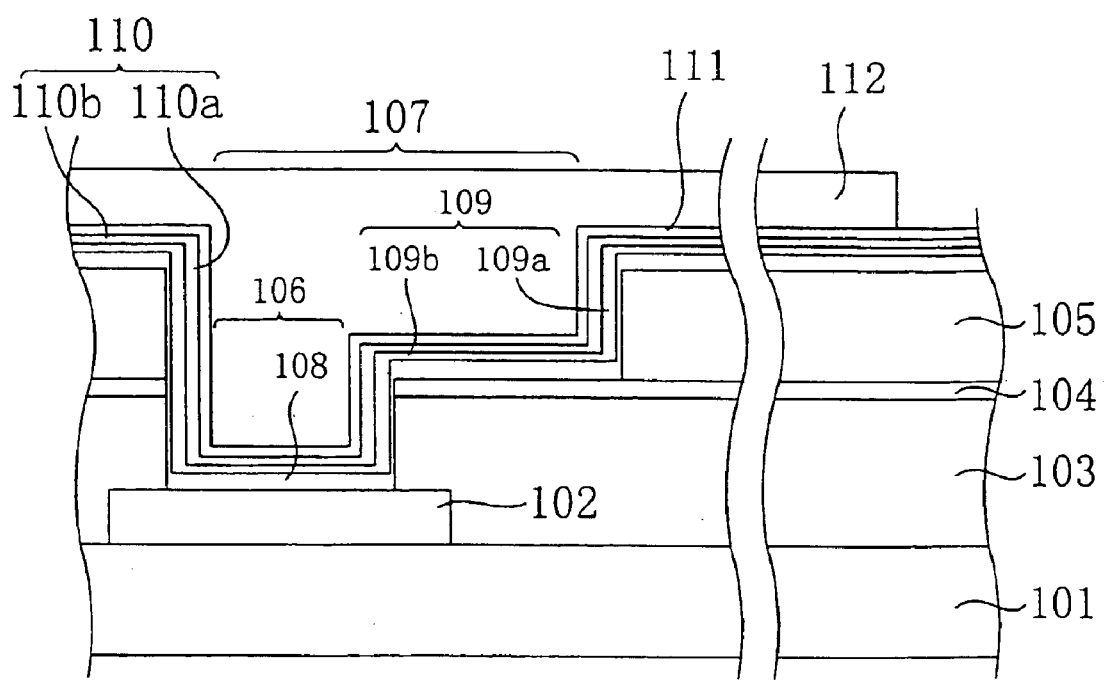
FIG. 6 is a cross-sectional view illustrating the first embodiment of the method for fabricating a semiconductor device according to the present invention.

Thereafter, as shown in FIG. 6, the Cu film (thickness: about 5 nm to about 200 nm) 111 is deposited on the surface of the TiSiN film 110 by a PVD process. However, the Cu film 111 is deposited only in the central region of the semiconductor substrate 101. After the Cu film 111 has been deposited, the surfaces of the TiSiN film 110b and the Cu film 111 are cleaned with sulfuric acid ($H_2SO_4$). Then, the Cu film (thickness: about 100 nm to about 1,000 nm) 112 is deposited on the surface of the Cu film 111 by an electroplating technique. In this process step, the Cu film does not grow on the surface of the TiSiN film 110b. The reason thereof will be described in greater detail later.

Finally, respective portions of the Ti film 108, TiN film 109, TiSiN film 110b and Cu films 111 and 112, which are deposited on the $SiO_2$ film 105, are removed by a chemical/mechanical polishing (CMP) technique to complete the semiconductor device shown in FIG. 7. Thereafter, respective process steps for forming additional upper-level interconnect layers are performed, if necessary.

Next, it will be described the reaction, through which the TiSiN film 110a is formed on the surface of the TiN film 109a as a result of the exposure to the $SiH_4$ gas.

Figure 8:
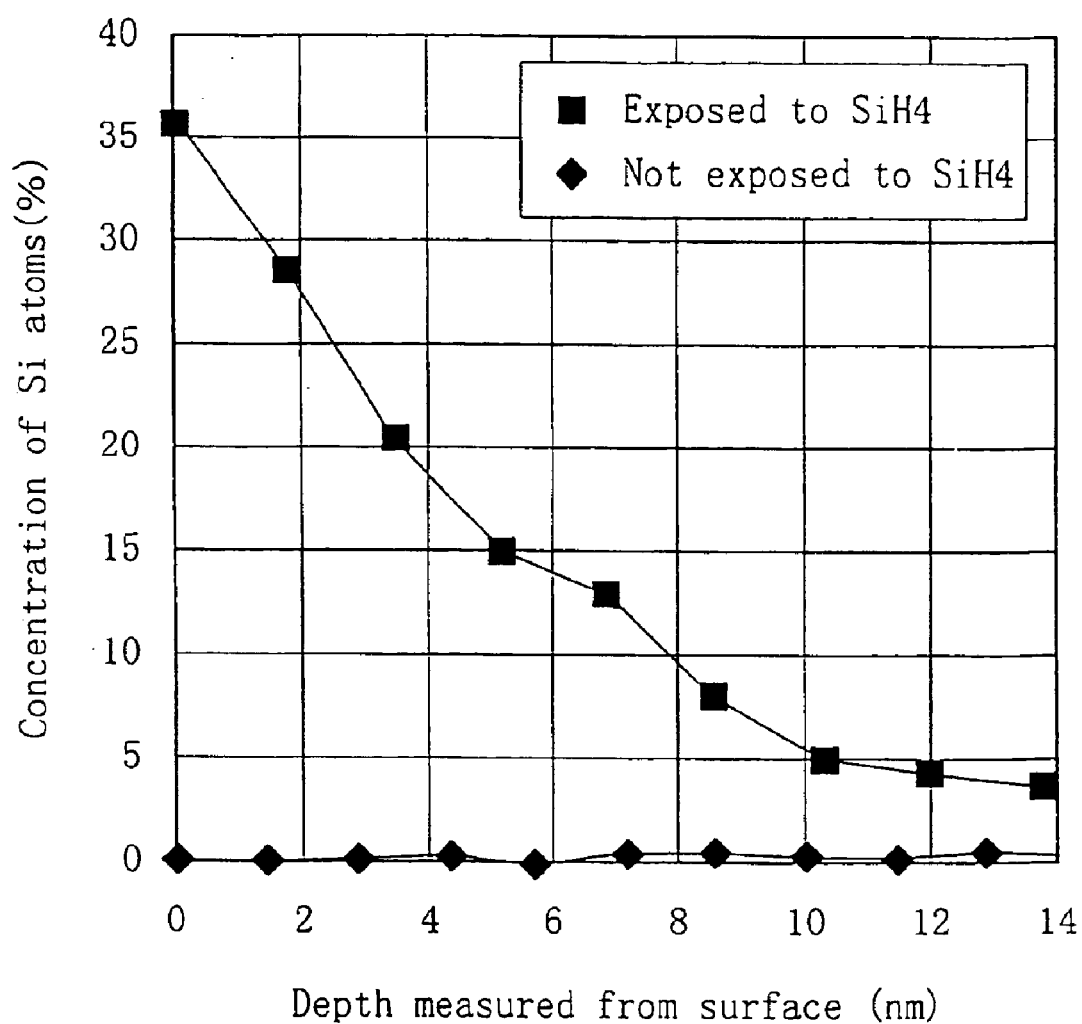
FIG. 8 is a graph illustrating the concentrations of silicon contained in respective titanium nitride layers formed on a plane vertical to the surface of a semiconductor substrate as a function of the depth measured from the surface thereof in the first embodiment of the present invention.

FIG. 8, FIGS. 9A and 9B and FIGS. 10A and 10B illustrate the results of analysis on this reaction by x-ray photoelectron spectroscopy (XPS). FIG. 8 illustrates the concentration of Si atoms in the TiN film 109a as a function of the depth measured from the surface thereof. As can be clearly understood from FIG. 8, if the TiN film 109a is exposed to the $SiH_4$ gas, a large amount of Si is contained in the TiN film 109a. Since the concentration of the Si atoms changes continuously, it is difficult to define the thickness thereof. Supposing the portion of the TiN film 109a where the concentration of Si is 5 atomic percent or more is called the "TiSiN film" for the sake of convenience, a TiSiN film 110a with a thickness of 10 nm is formed as a result of the exposure to the $SiH_4$ gas.

Figure 9A:
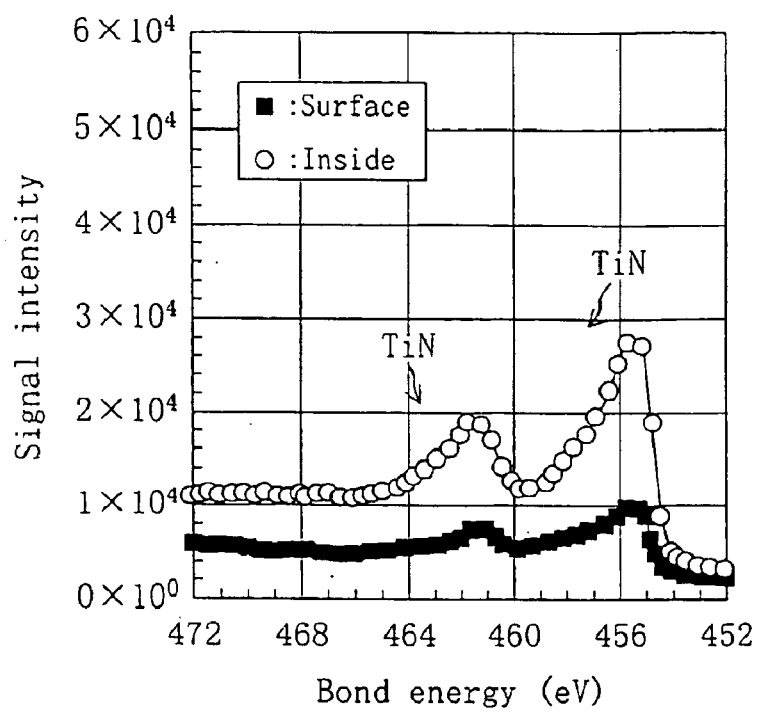
FIGS. 9A and 9B are graphs illustrating the results of an x-ray photoelectron spectroscopy (XPS) analysis on the surface and inside of a silicon-containing titanium nitride layer and a titanium nitride layer formed on the plane vertical to the surface of a semiconductor substrate in the first embodiment of the present invention.
Figure 9B:
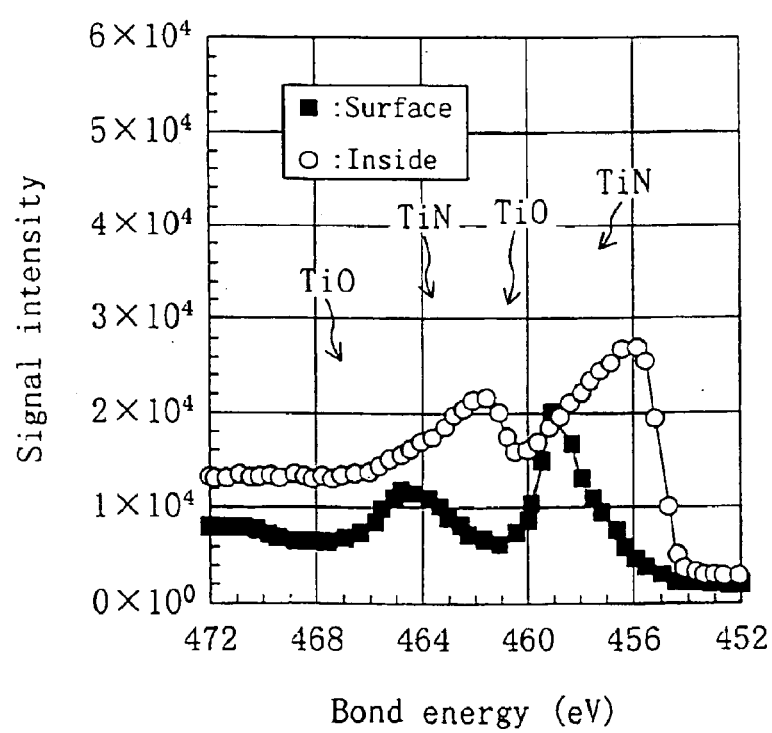
Figure 10A:
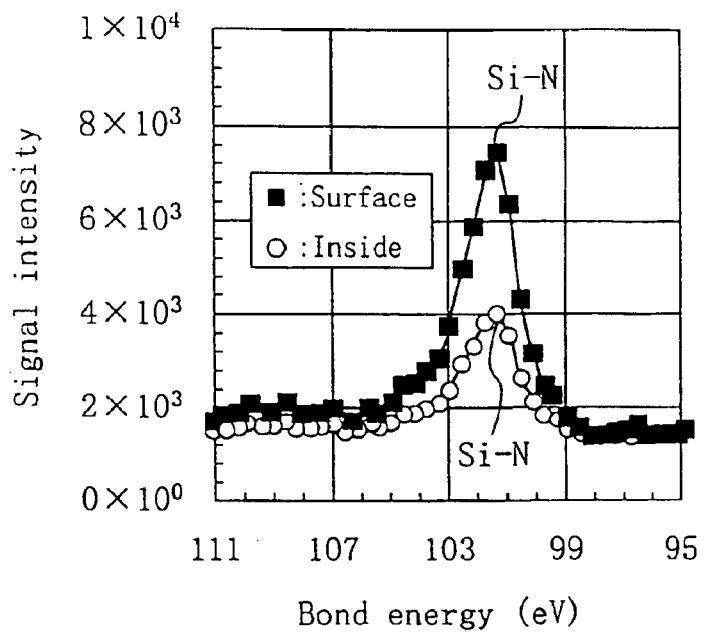
FIGS. 10A and 10B are graphs illustrating the results of an XPS analysis on the surface and inside of a silicon-containing titanium nitride layer and a titanium nitride layer formed on a plane vertical to the surface of a semiconductor substrate in the first embodiment of the present invention.
Figure 10B:
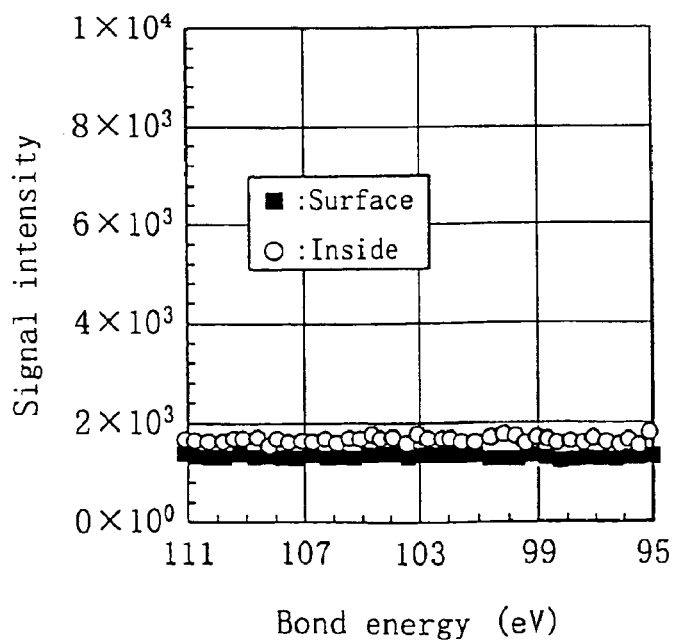

FIGS. 9A and 9B illustrate the XPS spectra of Ti atoms (Ti2p) contained in the TiSiN film 110a, which has been formed as a result of the exposure to $SiH_4$, and in the TiN film 109a, which has not been exposed to $SiH_4$, respectively. FIGS. 10A and 10B illustrate the XPS spectra of Si atoms (Si2p) contained in the TiSiN film 110a, which has been formed as a result of the exposure to $SiH_4$, and in the TiN film 109a, which has not been exposed to $SiH_4$, respectively.

As can be clearly seen from FIG. 10A, the existence of Si—N bonds is recognized on the surface and inside of the TiSiN film 110a, which has been formed as a result of the exposure to $SiH_4$. In contrast, in the TiN film 109a, which has not been exposed to $SiH_4$, no Si—N bonds are observed as shown in FIG. 10B. Since the Si—N bonds are much less likely to react with Cu atoms than Ti—N bonds, the ability of the TiSiN film 110a, including the Si—N bonds, to prevent the diffusion of Cu atoms is much higher than that of the TiN film. As can also be seen from FIGS. 10A and 10B, the number of Ti—O bonds decrease as a result of the exposure to $SiH_4$.

Figure 11:
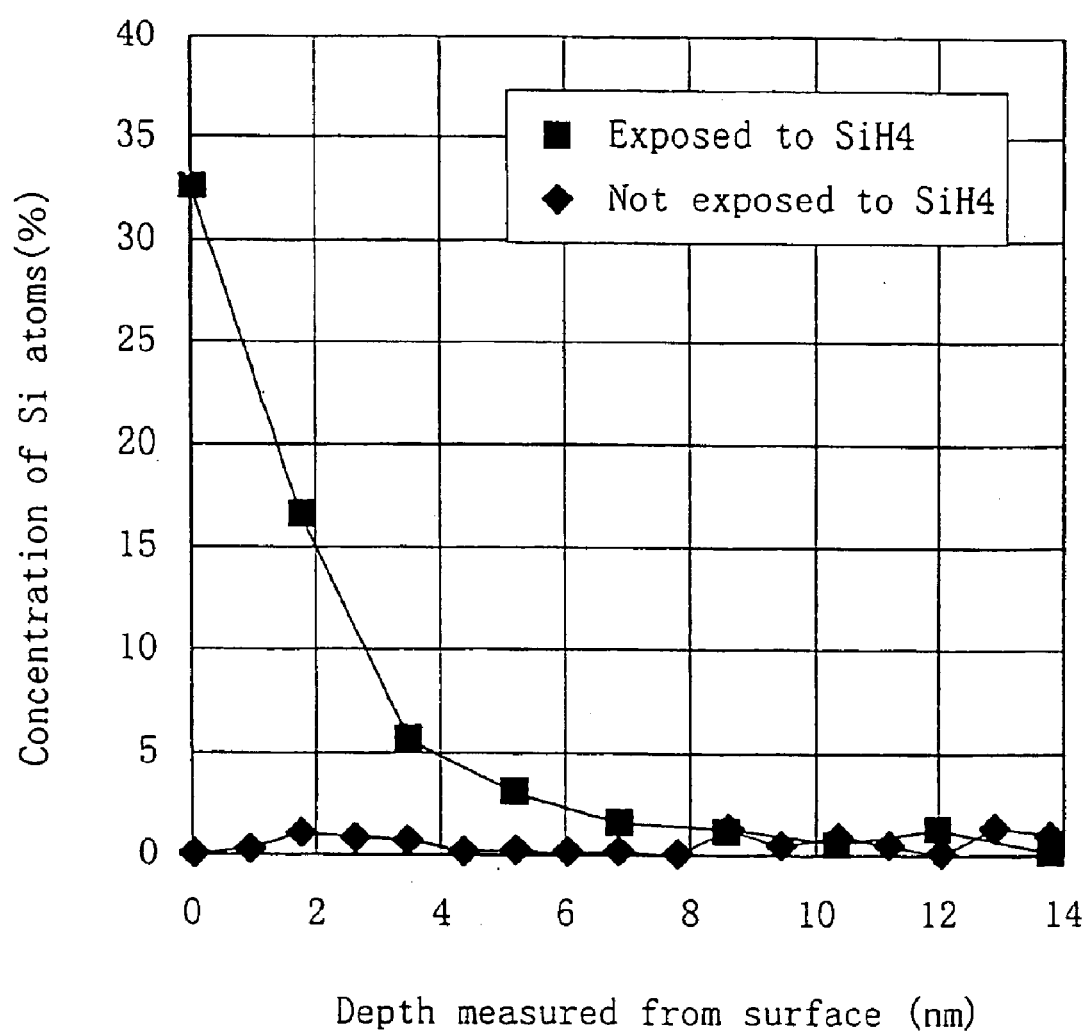
FIG. 11 is a graph illustrating the concentrations of silicon contained in respective titanium nitride layers formed on a plane parallel to the surface of a semiconductor substrate as a function of the depth measured from the surface thereof in the first embodiment of the present invention.

A similar reaction is also caused on the surface of the TiN film 109b. The results of XPS analysis on this reaction are shown in FIG. 11, FIGS. 12A and 12B and FIGS. 13A and 13B. FIG. 11 illustrates the concentration of Si atoms in the TiN film 109b, which has been exposed to $SiH_4$, as a function of the depth measured from the surface thereof. As can be clearly understood from FIG. 11, if the TiN film 109b is exposed to $SiH_4$, a large amount of Si is contained in the TiN film 109b. However, unlike the case of the TiN film 109a described above, the concentration of Si atoms in the TiN film 109b drastically decreases with the depth measured from the surface. In accordance with the definition described above, the thickness of the TiSiN film 110b formed through the exposure to $SiH_4$ is 4 nm, which accounts for about 40% of the thickness of the TiSiN film 110a. This is because the density of the TiN film 109b increases as a result of the exposure to the $N_2$ plasma.

Figure 12A:
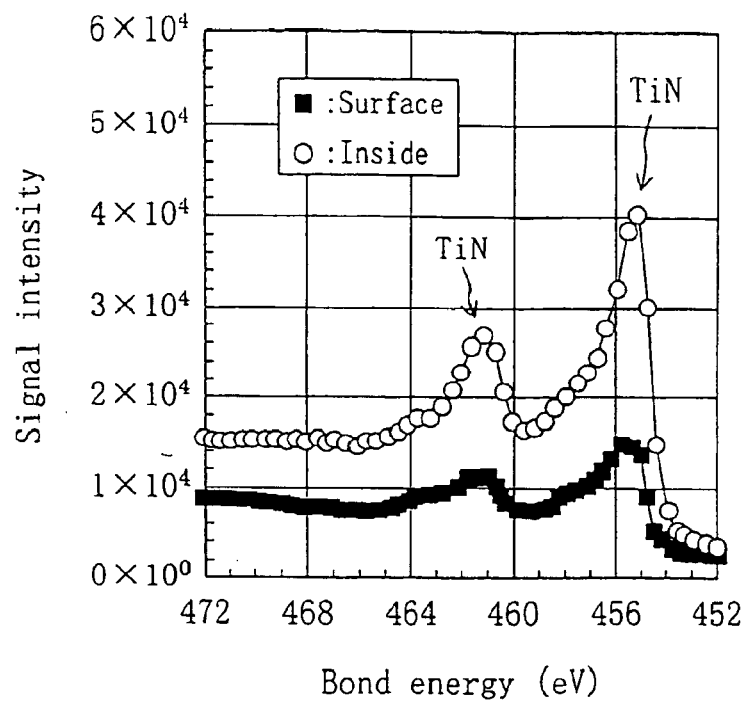
FIGS. 12A and 12B are graphs illustrating the results of an XPS analysis on the surface and inside of a silicon-containing titanium nitride layer and a titanium nitride layer formed on the plane parallel to the surface of a semiconductor substrate in the first embodiment of the present invention.
Figure 12B:
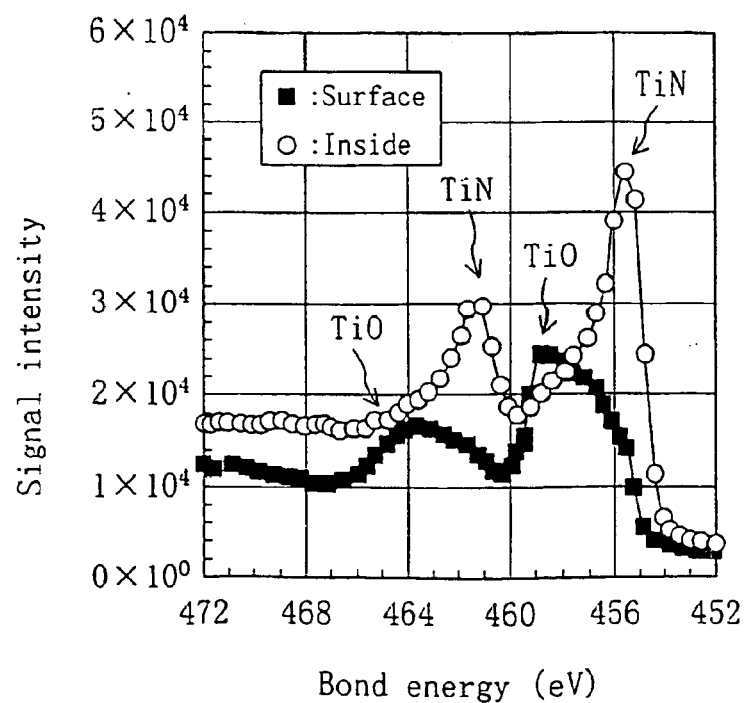
Figure 13A:
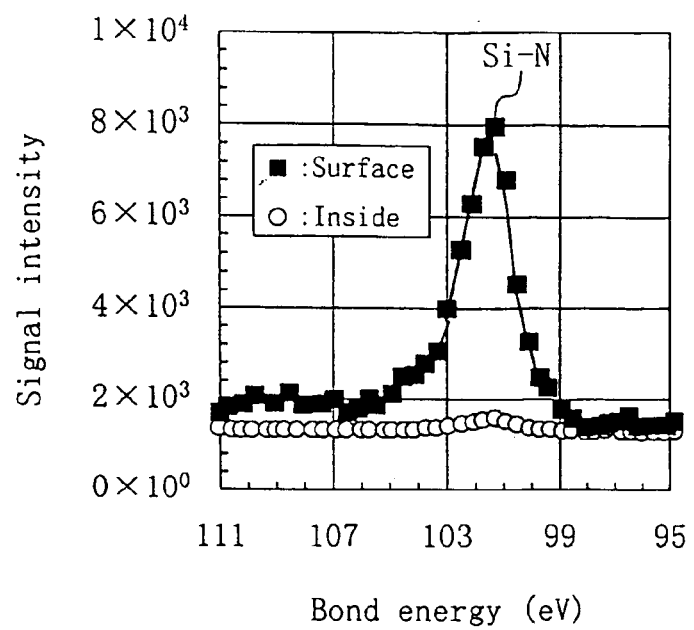
FIGS. 13A and 13B are graphs illustrating the results of an XPS analysis on the surface and inside of a silicon-containing titanium nitride layer and a titanium nitride layer formed on a plane parallel to the surface of a semiconductor substrate in the first embodiment of the present invention.
Figure 13B:
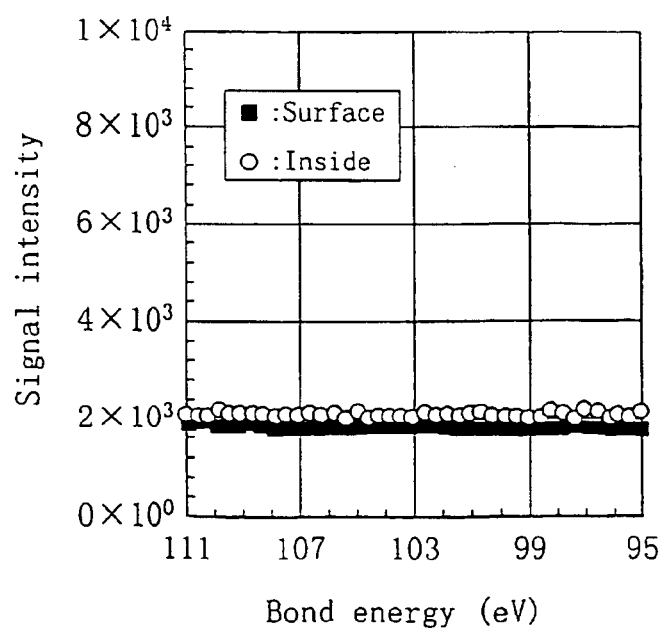

FIGS. 12A and 12B illustrate the XPS spectra of Ti atoms (Ti2p) contained in the TiSiN film 110b, which has been formed as a result of the exposure to $SiH_4$, and in the TiN film 109b, which has not been exposed to $SiH_4$, respectively. FIGS. 13A and 13B illustrate the XPS spectra of Si atoms (Si2p) contained in the TiSiN film 110b, which has been formed as a result of the exposure to $SiH_4$, and in the TiN film 109b, which has not been exposed to $SiH_4$, respectively.

As can be seen from FIG. 12B, Ti—O bonds are dominant on the surface of the TiN film 109b that has not been exposed to $SiH_4$. This is because titanium dioxide ($TiO_2$) has been formed on the surface of the TiN film 109b as a result of a reaction with oxygen in the air. On the other hand, Si—N bonds are dominant on the surface of the TiSiN film 110b that has been formed through the exposure to $SiH_4$ as shown in FIG. 13A. The existence of Ti—N bonds is also recognized on the surface of the TiSiN film 110b.

Next, the reason why the Cu film does not grow on the surface of the TiSiN film 110b during the electroplating will be described.

As shown in FIG. 12B, $TiO_2$ has been formed on the surface of the TiN film 109b that has not been exposed to $SiH_4$. However, this $TiO_2$ is completely removed during $H_2SO_4$ cleaning performed prior to the electroplating. Accordingly, during the electroplating, TiN comes into direct contact with the plating solution. Since TiN is a good electron conductor, TiN can easily donate ions to Cu ions contained in the plating solution. As a result, the Cu film abnormally grows on the surface of the TiN film 109b. On the other hand, on the surface of the TiSiN film 110b, which has been formed through the exposure to $SiH_4$, the Si—N bonds are dominant. The reactivity of Si—N bonds with $H_2SO_4$ is extremely low, as is clear from the fact that $Si_3N_4$ is insoluble in $H_2SO_4$. Thus, the TiSiN film 110b is not removed even when the film is cleaned with $H_2SO_4$. Also, since the Si—N bonds are so-called "covalent bonds", the valence electrons forming the bonds are strongly bound to the inner nucleus, and therefore do not contribute to the reduction reaction of the Cu ions. That is to say, since no electrons are donated from the surface of the TiSiN film 110 to Cu ions contained in the plating solution, no Cu film abnormally grows on the TiSiN film 110b.

Next, the thickness of the TiN film 109 during the deposition thereof will be described. If the thickness of the TiN film 109 is 1 nm or less, a TiSiN film 110 with a sufficient thickness cannot be formed even if the TiN film 109 is exposed to $SiH_4$. As a result, the ability of the TiSiN film 110 to prevent the diffusion of Cu atoms declines and an increased amount of leakage current flows between the through holes 106 and between adjacent portions of the upper interconnect layer 113. On the other hand, if the TiN film 109 is thicker than 50 nm, then the percentage of the Cu films 111 and 112 accounting for the entire cross-sectional area of the upper interconnect layer 113 decreases. As a result, the line resistance of the upper interconnect layer 113 increases and the operating speed of the semiconductor device decreases. This is why the thickness of the TiN film 109 during the deposition thereof is preferably in the range from 1 nm to 50 nm, both inclusive.

Next, a preferable temperature range of the semiconductor substrate 101 during the formation of the TiSiN film 110 will be described. If the temperature of the semiconductor substrate 101 is lower than 300° C., then the reaction of the TiN film 109 with $SiH_4$, which results in the TiSiN film 110, proceeds at a lower rate. Accordingly, it takes a considerably longer time to form the TiSiN film 110. Nevertheless, if the temperature of the semiconductor substrate 101 is higher than 500° C., then the properties of the lower interconnect layer 102 and the $SiO_2$ films 103 and 105 are likely to degrade. This is why the temperature of the semiconductor substrate 101 during the formation of the TiSiN film 110 is preferably in the range from 300° C. to 500° C., both inclusive.

Next, a preferable partial pressure range of $SiH_4$ during the formation of the TiSiN film 110 will be described. If the partial pressure of $SiH_4$ is lower than 1 Pa, then the reaction of the TiN film 109 with $SiH_4$, resulting in the TiSiN film 110, proceeds at a lower rate. Accordingly, it takes a considerably longer time to form the TiSiN film 110. This is why the partial pressure of $SiH_4$ during the formation of the TiSiN film 110 is preferably 1 Pa or higher.

Next, an apparatus used for fabricating this semiconductor device will be described with reference to FIG. 14. This apparatus includes: a vacuum chamber 114; a susceptor 115 placed inside the vacuum chamber 114; an upper electrode 121 placed within the chamber 114 to face the susceptor 115; and a radio frequency power supply 122 connected to the susceptor 115 and upper electrode 121. A heating mechanism 116 is built in the susceptor 115. The vacuum chamber 114 includes exhaust port 117, TDMAT inlet port 118, $N_2$ inlet port 119 and $SiH_4$ inlet port 120.

This apparatus for fabricating a semiconductor device operates as follows.

First, the inside of the vacuum chamber 114 is opened to the air, and the semiconductor substrate 101, on which the Ti film 108 has already been deposited, is placed on the susceptor 115. Then, the vacuum chamber 114 is evacuated through the exhaust port 117. After the evacuation is over, the heating mechanism 116 is activated, thereby heating the semiconductor substrate 101 through the susceptor 115. The output of the heating mechanism 116 is adjusted at such a value that the steady temperature of the semiconductor substrate 101 becomes 350° C. When the temperature of the semiconductor substrate 101 reaches the steady temperature, a TDMAT gas diluted with He is introduced into the chamber 114 through the TDMAT inlet port 118. As a result, the TDMAT is thermally decomposed on the surface of the Ti film 108, whereby the TiN film 109 is deposited thereon. After a predetermined time has passed, the supply of TDMAT through the TDMAT inlet port 118 is stopped and $N_2$ is introduced through the $N_2$ inlet port 119 into the chamber 114 instead. When the partial pressure of $N_2$ inside the vacuum chamber 114 is stabilized, power is supplied from the radio frequency power supply 122 to the susceptor 115 and upper electrode 121, thereby generating $N_2$ plasma inside the vacuum chamber 114. As a result, the TiN film 109a deposited on a plane parallel to the surface of the semiconductor substrate 101 receives the impact of ion collision and the density thereof increases. After a predetermined time has passed, the radio frequency power supply 122 is stopped and the supply of $N_2$ through the $N_2$ inlet port 119 is also stopped. Then, $SiH_4$ is introduced through the $SiH_4$ inlet port 120. As a result, the TiSiN film 110 is formed on the surface of the TiN film 109. Finally, the operation of the heating mechanism 116 is stopped, the vacuum chamber 114 is opened to the air and then the semiconductor substrate 101 is ejected.

Embodiment 2

Next, a second exemplary embodiment of the present invention will be described with reference to FIGS. 15, 16, 17, 18, 19 and 20. In FIGS. 15 through 20, the same components as those illustrated in FIGS. 1 through 7 are identified by the same reference numerals, and the detailed description thereof will be omitted herein.

Figure 20:
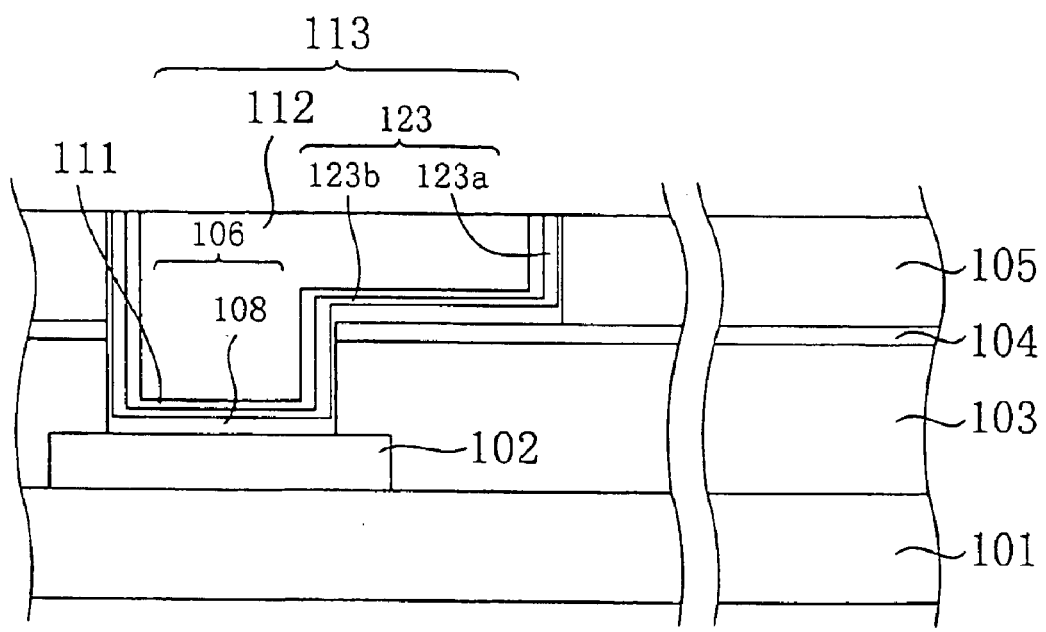
FIG. 20 is a cross-sectional view illustrating a second embodiment of a semiconductor device according to the present invention.

As shown in FIG. 20, the semiconductor device of the second embodiment includes: a semiconductor substrate 101; a lower interconnect layer 102; and an $SiO_2$ film 103. On the semiconductor substrate 101, integrated circuit devices such as transistors are formed although not shown in FIG. 20. The lower interconnect layer 102 is formed on the surface of the semiconductor substrate 101. And the $SiO_2$ film 103 is deposited on the semiconductor substrate 101 to cover the lower interconnect layer 102.

An $Si_3N_4$ film 104 is deposited over the $SiO_2$ film 103, and another $SiO_2$ film 105 is deposited on the $Si_3N_4$ film 104. An interlevel dielectric film is made up of the $SiO_2$ film 103, $Si_3N_4$ film 104 and $SiO_2$ film 105. In the interlevel dielectric film, a through hole 106, reaching the lower interconnect layer 102, and an interconnection channel 107, communicating with the through hole 106, are formed. An upper interconnect layer 113, which is in electrical contact with the lower interconnect layer 102 via the through hole 106, is formed within the interconnection channel 107. The upper interconnect layer 113 includes: a Ti film 108 covering the inner side faces and bottom of the through hole 106 and interconnection channel 107; a TiSiN film 123 deposited on the Ti film 108; a Cu film 111 deposited on the TiSiN film 123; and another Cu film 112 deposited on the Cu film 111.

In this embodiment, the TiSiN film 123 will be regarded as including vertical portions 123a and horizontal portions 123b if necessary. The vertical portions 123a are formed on the inner sidewalls of the through hole 106 and interconnection channel 107, i.e., on respective planes substantially vertical to the surface of the semiconductor substrate 101.

On the other hand, the horizontal portions 123*b* are formed on the bottoms of the through hole 106 and interconnection channel 107, i.e., on respective planes substantially parallel to the surface of the semiconductor substrate 101.

Figure 19:
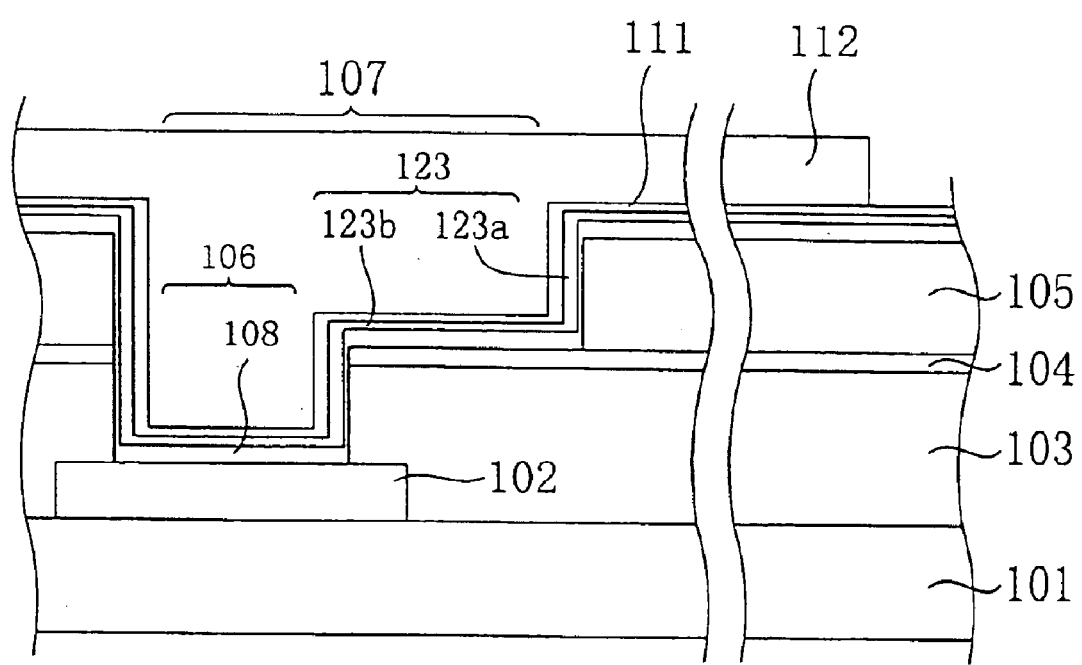
FIG. 19 is a cross-sectional view illustrating the second embodiment of the method for fabricating a semiconductor device according to the present invention.

The structure of the second embodiment is different from that of the first embodiment in that no TiN film is interposed between the Ti film 108 and the TiSiN film 123 in this embodiment as shown in FIG. 19. The ability of the TiSiN film 123 to prevent the diffusion of Cu atoms is higher than that of the TiN film, as described above. Thus, in the structure of this embodiment, the leakage current flowing between the through holes 106 and between adjacent portions of the upper interconnect layer 113 can be further reduced than the first embodiment. Even if no TiN film is interposed between the Ti film 108 and TiSiN film 123 as in this embodiment, the concentration of Si in the TiSiN film 123*a* is preferably 5 atomic percent or more as already described in the first embodiment. The thickness of the TiSiN film 123*a* is preferably in the range from 1 nm to 50 nm, both inclusive. Also, the TiSiN film 123*b* is preferably thinner than the TiSiN film 123*a*.

Hereinafter, a method for fabricating this semiconductor device will be described with reference to the accompanying drawings.

Figure 15:
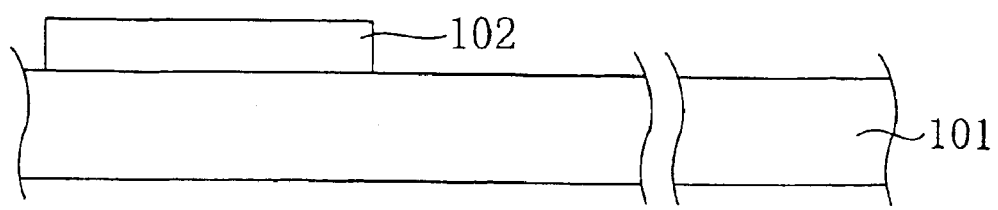
FIG. 15 is a cross-sectional view illustrating a second embodiment of a method for fabricating a semiconductor device according to the present invention.
Figure 16:
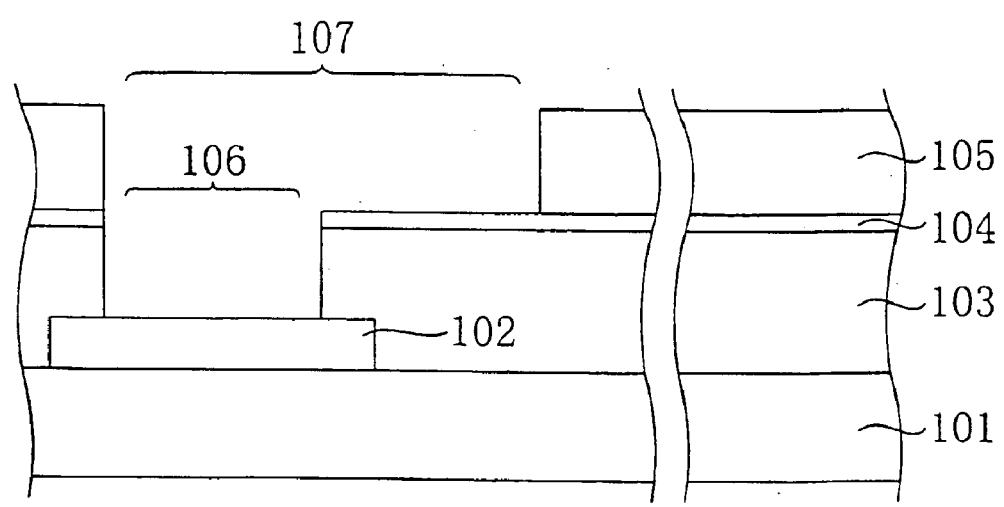
FIG. 16 is a cross-sectional view illustrating the second embodiment of the method for fabricating a semiconductor device according to the present invention.
Figure 17:
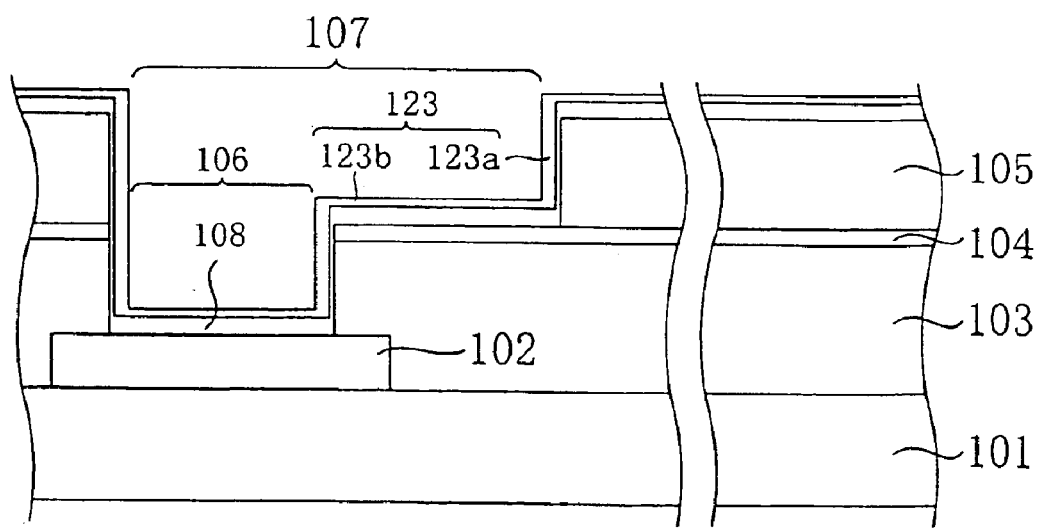
FIG. 17 is a cross-sectional view illustrating the second embodiment of the method for fabricating a semiconductor device according to the present invention.

First, as shown in FIG. 15, the lower interconnect layer 102 is formed on the surface of the semiconductor substrate 101. Next, as shown in FIG. 16, the $SiO_2$ film (thickness: about 100 nm to about 2,000 nm) 103, $Si_3N_4$ film (thickness: about 5 nm to about 50 nm) 104 and $Si_{O2}$ film (thickness: about 100 nm to about 1,000 nm) 105 are deposited in this order. Then, these films are alternately subjected to photolithography and dry etching twice, thereby forming the through hole 106 inside the $SiO_2$ film 103 and $Si_3N_4$ film 104 and the interconnection channel 107 inside the $SiO_2$ film 105. Next, as shown in FIG. 17, the bottom of the through hole 106 is cleaned by dry etching. Then, the Ti film (thickness: about 0.5 nm to about 10 nm) 108 is deposited by a PVD process and the TiSiN film (thickness: about 1 nm to about 50 nm) 123 is deposited by a CVD process.

The TiSiN film 123 may be deposited by the CVD process in the following manner. The semiconductor substrate 101, on which the Ti film 108 has already been deposited, is heated up to 350° C. within a vacuum chamber. When the semiconductor substrate 101 reaches its steady temperature, TDMAT, diluted with He, and $SiH_4$ are simultaneously introduced into the vacuum chamber. In this case, the amounts of TDMAT and $SiH_4$ introduced are adjusted at such values that the partial pressures of TDMAT and $SiH_4$ inside the vacuum chamber becomes 6 Pa and 1 Pa, respectively. The TDMAT introduced reacts with $SiH_4$ on the surface of the Ti film 108, whereby the TiSiN film 123 is deposited thereon. In this embodiment, the thickness of the TiSiN film 123 deposited is 20 nm.

Figure 18:
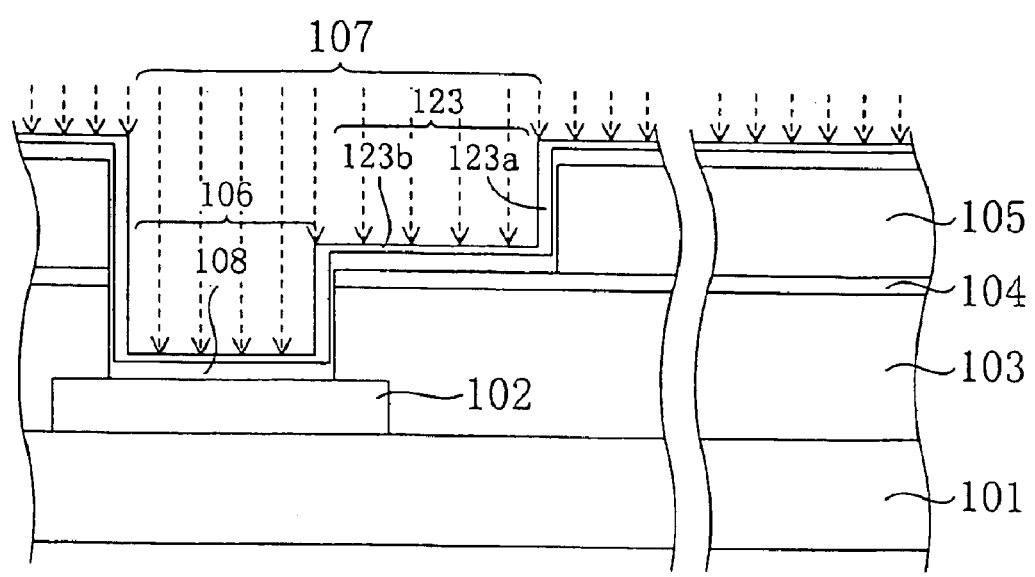
FIG. 18 is a cross-sectional view illustrating the second embodiment of the method for fabricating a semiconductor device according to the present invention.

Subsequently, as shown in FIG. 18, the surface of the TiSiN film 123 is exposed to $N_2$ plasma. In this case, the TiSiN film 123*b* deposited on the plane parallel to the surface of the semiconductor substrate 101 receives the impact of ion collision effectively. As a result, the density of the TiSiN film 123 increases. On the other hand, since the TiSiN film 123*a* deposited on the planes substantially vertical to the surface of the semiconductor substrate 101 hardly receives the impact of ion collision, the density thereof does not change. The effect of the $N_2$ plasma exposure on the TiSiN films 123*a* and 123*b* will be described in greater detail later.

Thereafter, as shown in FIG. 19, the Cu film (thickness: about 5 nm to about 200 nm) 111 is deposited by a PVD process on the surface of the TiSiN film 123. However, the Cu film 111 is deposited only in the central region of the semiconductor substrate 101. After the Cu film 111 has been deposited, the surfaces of the TiSiN film 123*b* and the Cu film 111 are cleaned with $H_2SO_4$. Then, the Cu film (thickness: about 100 nm to about 1,000 nm) 112 is deposited thereon by an electroplating technique. In this process step, the Cu film does not grow on the surface of the TiSiN film 123*b*. Finally, respective portions of the Ti film 108, TiSiN film 123*b* and Cu films 111 and 112, which are deposited on the $SiO_2$ film 105, are removed by a CMP technique to complete the semiconductor device shown in FIG. 20.

Figure 21:
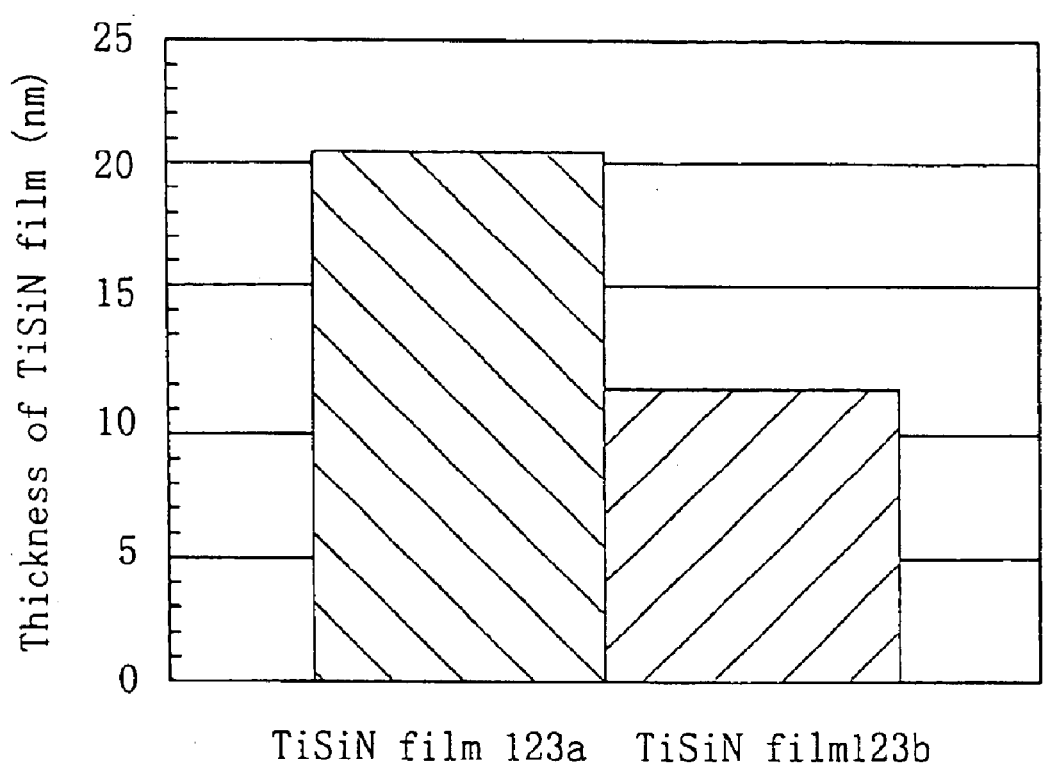
FIG. 21 is a graph illustrating in comparison respective thicknesses of a silicon-containing titanium nitride layer deposited on plane vertical to the surface of a semiconductor substrate and a silicon-containing titanium nitride layer deposited on a plane parallel thereto in the second embodiment of the present invention.

FIG. 21 illustrates thicknesses of the TiSiN films 123*a* and 123*b*, which have been exposed to the $N_2$ plasma. These thicknesses are measured with a transmission electron microscope (TEM). As is clear from FIG. 21, the TiSiN film 123*b* is thinner than the TiSiN film 123*a*. This is because the density of the TiSiN film 123*b* has increased after the TiSiN film 123*b* has received the impact of ion collision due to the exposure to the $N_2$ plasma.

Figure 22A:
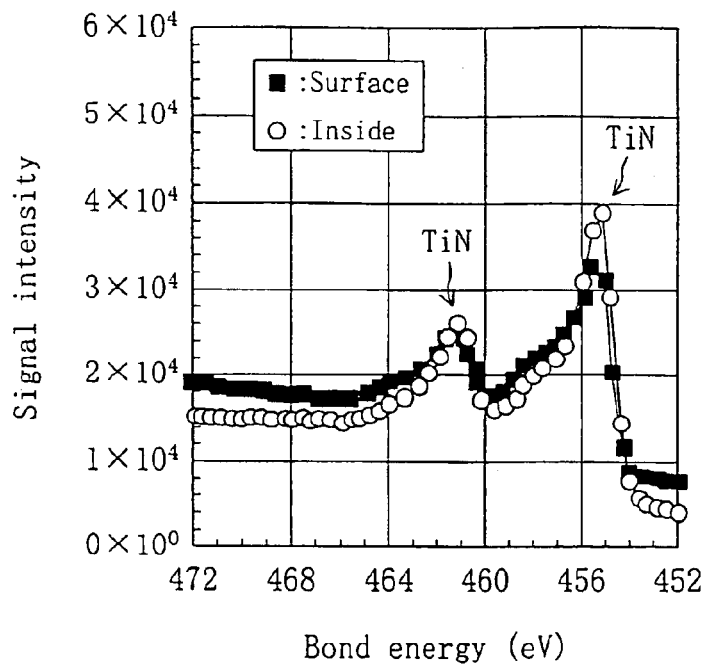
FIGS. 22A and 22B are graphs illustrating the XPS spectra of Ti atoms (Ti2p) contained in the surfaces and inside of a silicon-containing titanium nitride layer formed on a plane vertical to the surface of a semiconductor substrate and a silicon-containing titanium nitride layer formed on a plane parallel thereto, respectively, in the second embodiment of the present invention.
Figure 22B:
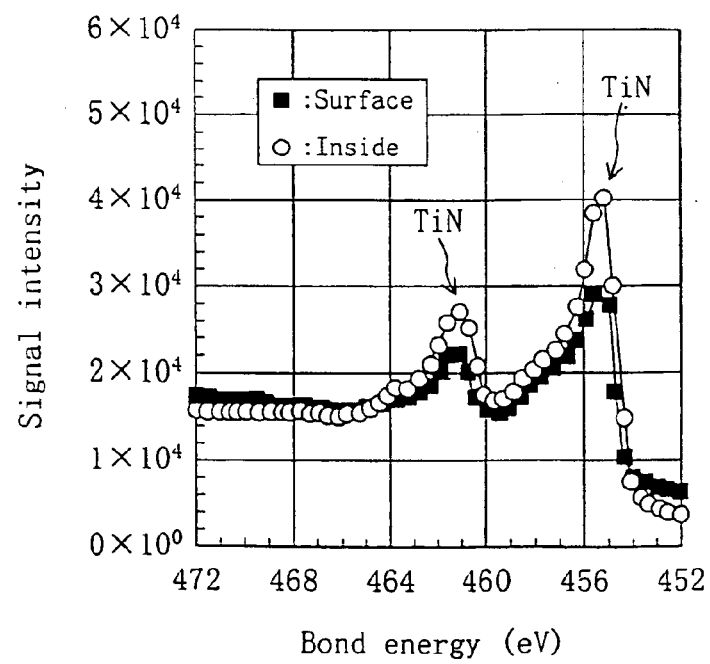
Figure 23A:
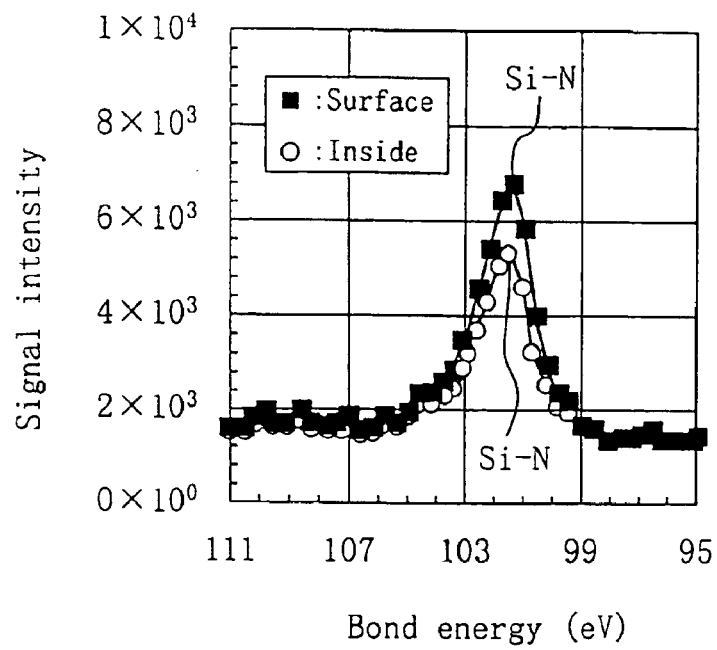
FIGS. 23A and 23B are graphs illustrating the XPS spectra of Si atoms (Si2p) contained in the surfaces and inside of a silicon-containing titanium nitride layer formed on a plane vertical to the surface of a semiconductor substrate and a silicon-containing titanium nitride layer formed on a plane parallel thereto, respectively, in the second embodiment of the present invention.
Figure 23B:
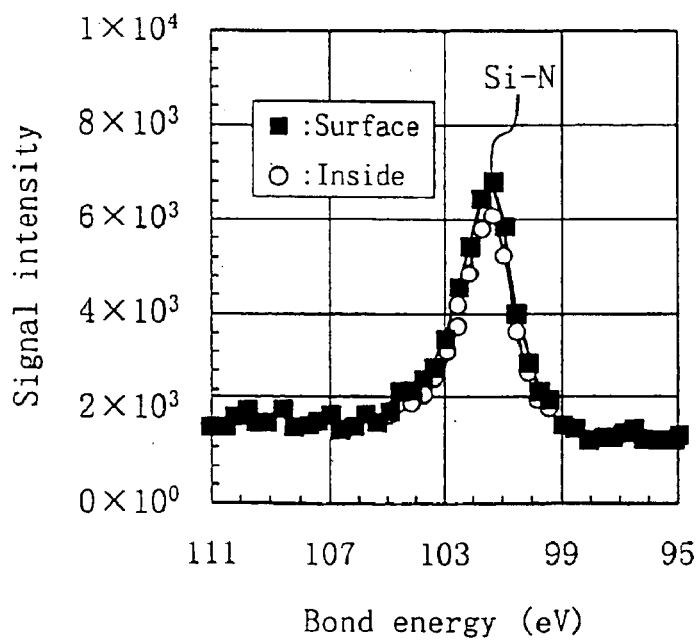

The results of an XPS analysis on the compositions and chemical structures of the TiSiN films 123*a* and 123*b* are illustrated in FIGS. 22A and 22B and FIGS. 23A and 23B. FIGS. 22A and 22B illustrate the XPS spectra of Ti atoms (Ti2p) contained in the TiSiN films 123*a* and 123*b*, respectively. FIGS. 23A and 23B illustrate the XPS spectra of Si atoms (Si2p) contained in the TiSiN films 123*a* and 123*b*, respectively. As can be clearly seen from FIGS. 23A and 23B, Si contained in the TiSiN films 123*a* and 123*b* is in the form of Si—N bonds. Thus; the TiSiN film 123*a* can effectively prevent the diffusion of Cu atoms. Also, since Si—N bonds are dominant on the surface of the TiSiN film 123*b*, no Cu film abnormally grows on the surface of the TiSiN film 123*b*.

Figure 24:
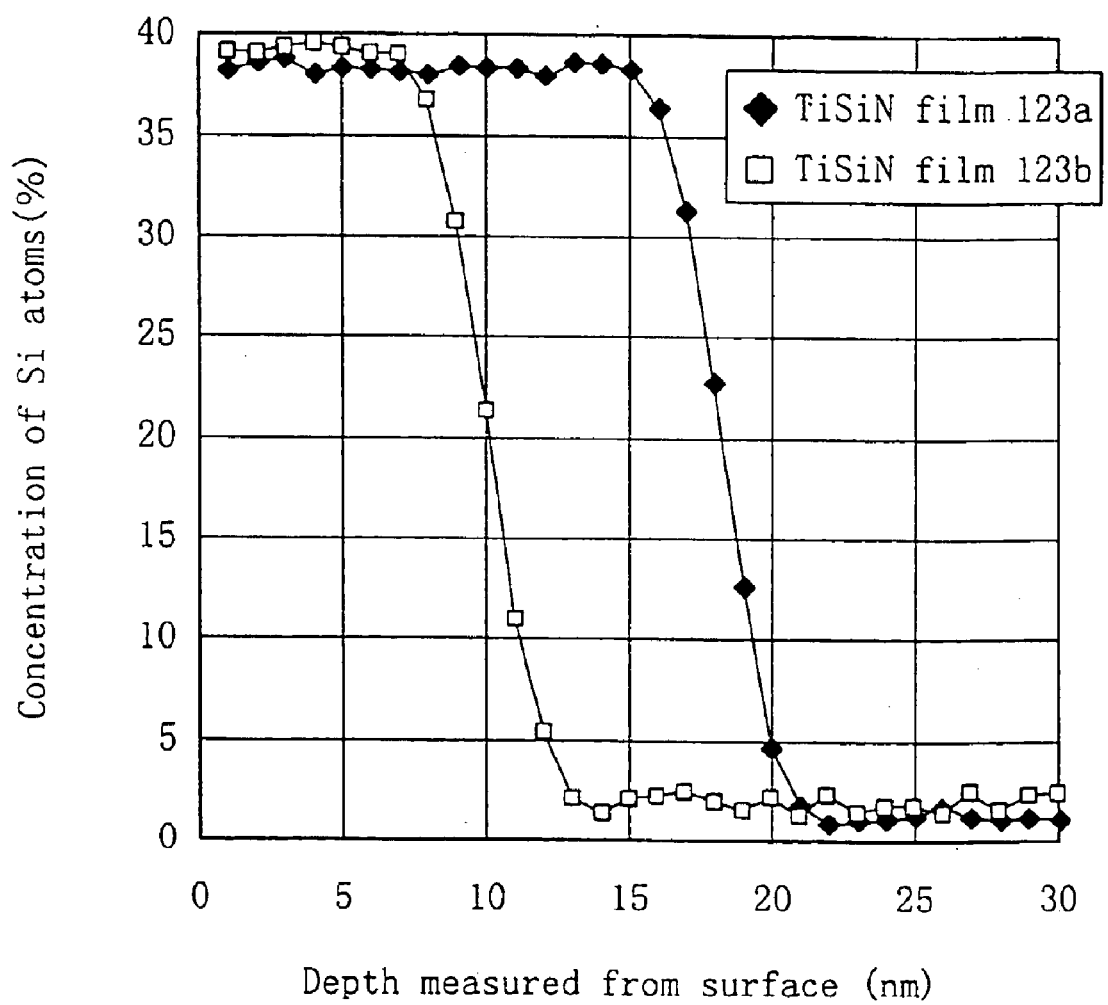
FIG. 24 is a graph illustrating respective concentrations of silicon contained in a silicon-containing titanium nitride layer formed on a plane parallel to the surface of a semiconductor substrate and in a silicon-containing titanium nitride layer formed on a plane vertical thereto as a function of the depth measured from the surface thereof in the second embodiment of the present invention.
Figure 25:
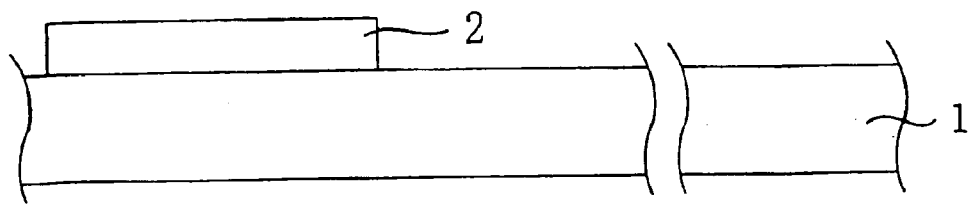
FIG. 25 is a cross-sectional view illustrating a conventional method for fabricating a semiconductor device.
Figure 26:
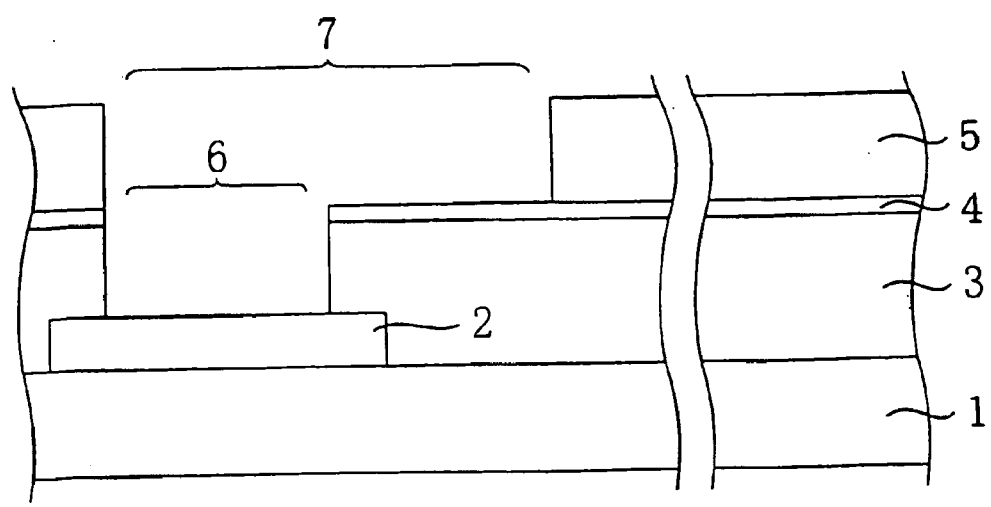
FIG. 26 is a cross-sectional view illustrating the conventional method for fabricating a semiconductor device.
Figure 27:
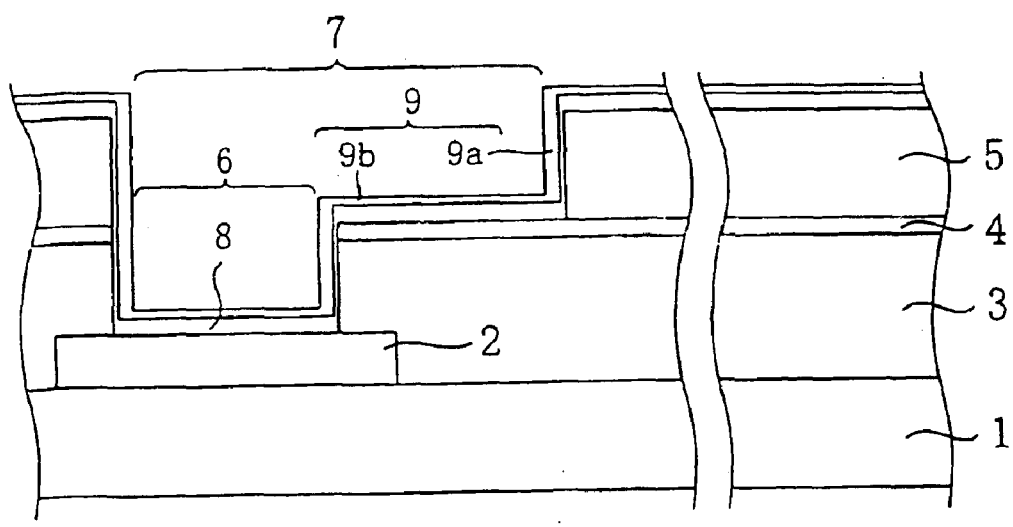
FIG. 27 is a cross-sectional view illustrating the conventional method for fabricating a semiconductor device.
Figure 28:
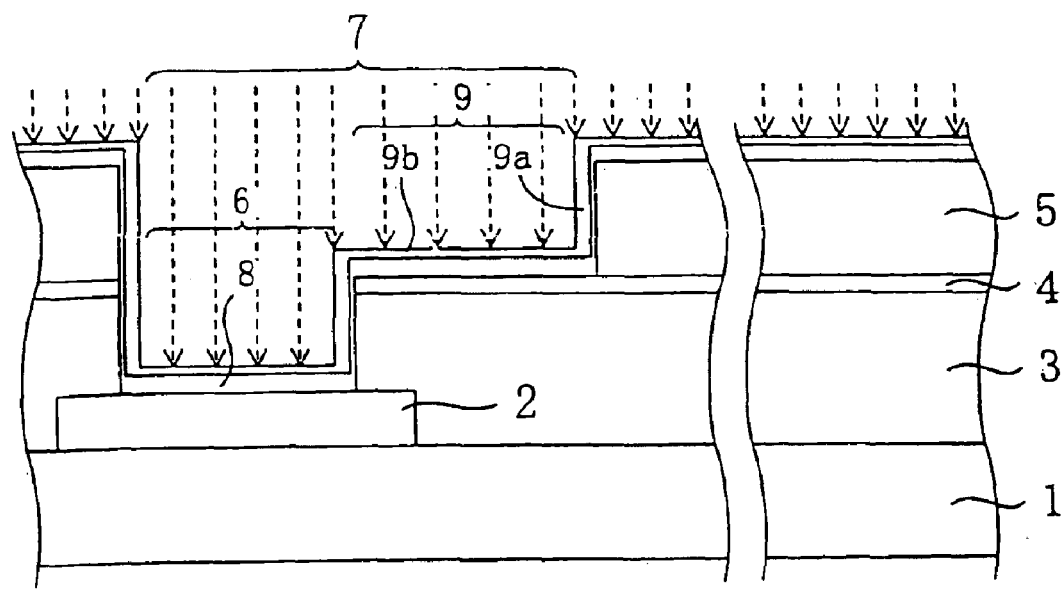
FIG. 28 is a cross-sectional view illustrating the conventional method for fabricating a semiconductor device.
Figure 29:
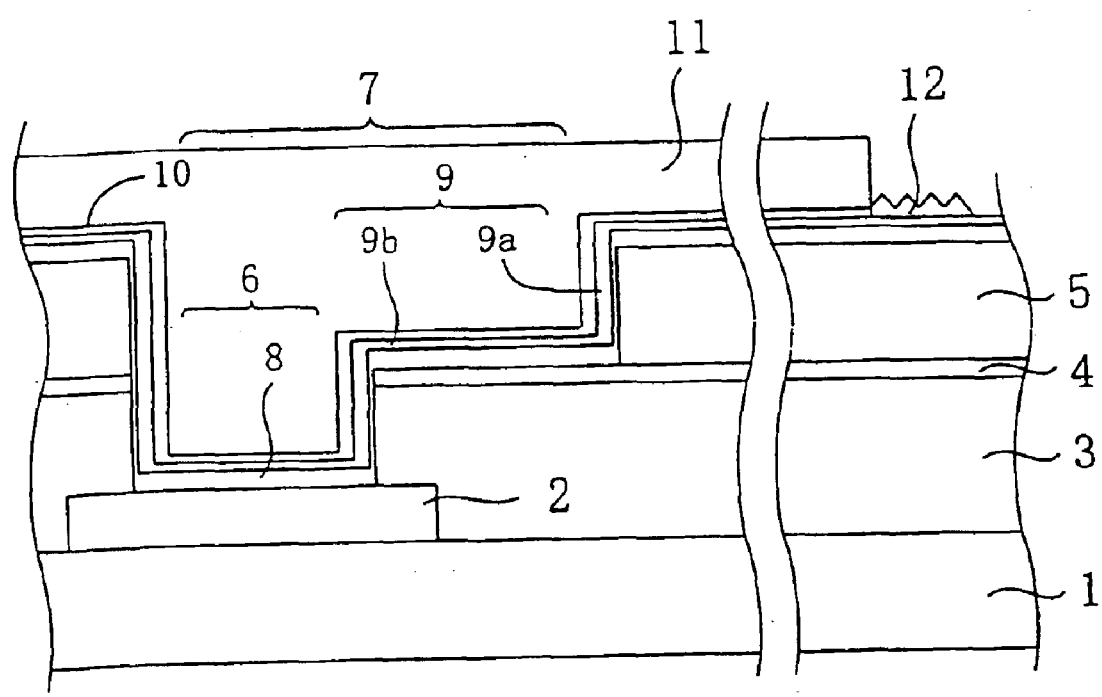
FIG. 29 is a cross-sectional view illustrating the conventional method for fabricating a semiconductor device.
Figure 30:
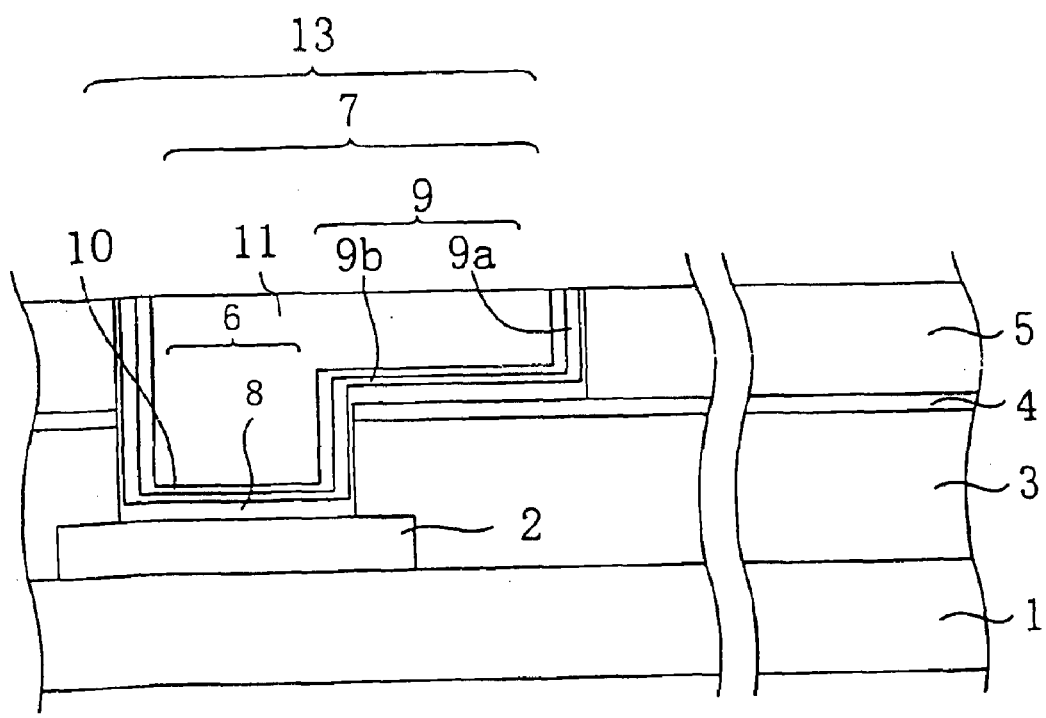
FIG. 30 is a cross-sectional view illustrating a conventional semiconductor device.

FIG. 24 illustrates the concentrations of Si atoms in the TiSiN films 123*a* and 123*b* as a function of the depth measured from the surface thereof. As can be clearly understood from FIG. 24, a large amount of Si is contained on the surface and inside of both the TiSiN films 123*a* and 123*b*. The concentration of Si in the TiSiN film 123*a* is higher than that of Si in the TiSiN film 110*a* in the first embodiment. Thus, if a semiconductor device is fabricated by the method of this embodiment, the leakage current flowing between the through holes 106 and between adjacent portions of the upper interconnect layer 113 can be further reduced than the first embodiment.

Next, a preferable temperature range of the semiconductor substrate 101 during the deposition of the TiSiN film 123 will be described. If the temperature of the semiconductor substrate 101 is lower than 250° C., then the reaction of TDMAT with $SiH_4$ proceeds at a lower rate. Accordingly, it takes a considerably longer time to deposit the TiSiN film 123. On the other hand, if the temperature of the semiconductor substrate 101 is higher than 450° C., then the thermal decomposition reaction of TDMAT enters a so-called "mass-transport limited regime". As a result, the step coverage of the TiSiN film 123 decreases. This is why the temperature of the semiconductor substrate 101 during the deposition of the TiSiN film 123 is preferably in the range from 250° C. to 450° C., both inclusive.

Next, preferable partial pressure ranges of TDMAT and $SiH_4$ during the formation of the TiSiN film 123 will be described. If the partial pressures of TDMAT and $SiH_4$ are lower than 3 Pa and 0.5 Pa, respectively, then the reaction resulting in the TiSiN film 123 from TDMAT and $SiH_4$ proceeds at a lower rate. As a result, it takes a considerably longer time to form the TiSiN film 123. This is why the partial pressures of TDMAT and SiH$_4$ during the formation of the TiSiN film 123 are preferably 3 Pa or higher and 0.5 Pa or higher, respectively.

Next, the thickness of the TiSiN film 123 during the deposition thereof will be described. If the thickness of the TiSiN film 123 is 1 nm or less, a TiSiN film 123a with a sufficient thickness cannot be formed even if the Ti film 108 is exposed to the N$_2$ plasma. As a result, the ability of the TiSiN film 123 to prevent the diffusion of Cu atoms declines and an increased amount of leakage current flows between the through holes 106 and between adjacent portions of the upper interconnect layer 113. On the other hand, if the TiSiN film 123 is thicker than 50 nm, then the percentage of the Cu films 111 and 112 accounting for the entire cross-sectional area of the upper interconnect layer 113 decreases. As a result, the line resistance of the upper interconnect layer 113 increases and the operating speed of the semiconductor device decreases. This is why the thickness of the TiSiN film 123 during the deposition thereof is preferably in the range from 1 nm to 50 nm, both inclusive.

The semiconductor device of this embodiment can be fabricated by operating the fabricating apparatus shown in FIG. 14 in the following manner. First, the inside of the vacuum chamber 114 is opened to the air, and the semiconductor substrate 101, on which the Ti film 108 has already been deposited, is placed on the susceptor 115. Then, the vacuum chamber 114 is evacuated through the exhaust port 117. After the evacuation is over, the heating mechanism 116 is activated, thereby heating the semiconductor substrate 101 through the susceptor 115. The output of the heating mechanism 116 is adjusted at such a value that the steady temperature of the semiconductor substrate 101 becomes 350° C. When the temperature of the semiconductor substrate 101 reaches the steady temperature, TDMAT, diluted with He, and SiH$_4$ are introduced into the chamber 114 through the TDMAT inlet port 118 and the SiH$_4$ inlet port 120, respectively. As a result, the TDMAT reacts with SiH$_4$ on the surface of the Ti film 108, whereby the TiSiN film 123 is deposited thereon. After a predetermined time has passed, the supply of TDMAT and SiH$_4$ is stopped, and N$_2$ is introduced through the N$_2$ inlet port 119 into the chamber 114 instead. When the partial pressure of N$_2$ inside the vacuum chamber 114 is stabilized, power is supplied from the radio frequency power supply 122 to the susceptor 115 and upper electrode 121, thereby generating N$_2$ plasma inside the vacuum chamber 114. As a result, the TiSiN film 123a deposited on a plane parallel to the surface of the semiconductor substrate 101 receives the impact of ion collision and the density thereof increases. After a predetermined time has passed, the radio frequency power supply 122 is stopped and the supply of N$_2$ through the N$_2$ inlet port 119 is also stopped. Finally, the operation of the heating mechanism 116 is stopped, the vacuum chamber 114 is opened to the air and the semiconductor substrate 101 is ejected.

Embodiment 3

Next, a third exemplary embodiment of the present invention will be described with reference to FIGS. 31, 32, 33, 34, 35, 36 and 37. In FIGS. 31 through 37, the same components as those illustrated in FIGS. 1 through 7 are identified by the same reference numerals, and the detailed description thereof will be omitted herein.

Figure 37:
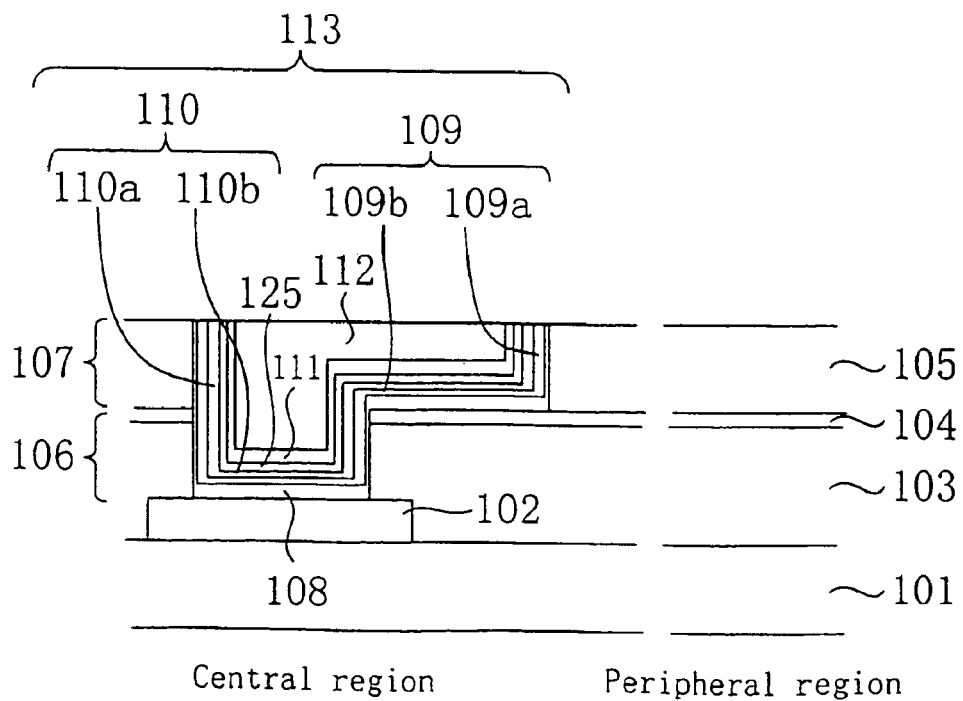
FIG. 37 is a cross-sectional view illustrating a third embodiment of a semiconductor device according to the present invention.

As shown in FIG. 37, the semiconductor device of the third embodiment includes: a semiconductor substrate 101; a lower interconnect layer 102; and an SiO$_2$ film 103. On the semiconductor substrate 101, integrated circuit devices such as transistors are formed although not shown in FIG. 37. The lower interconnect layer 102 is formed on the surface of the semiconductor substrate 101. And the SiO$_2$ film 103 is deposited on the semiconductor substrate 101 to cover the lower interconnect layer 102.

An Si$_3$N$_4$ film 104 is deposited over the SiO$_2$ film 103, and another SiO$_2$ film 105 is deposited on the Si$_3$N$_4$ film 104. An interlevel dielectric film is made up of the SiO$_2$ film 103, Si$_3$N$_4$ film 104 and SiO$_2$ film 105. In the interlevel dielectric film, a through hole 106, reaching the lower interconnect layer 102, and an interconnection channel 107, communicating with the through hole 106, are formed. An upper interconnect layer 113, which is in electrical contact with the lower interconnect layer 102 via the through hole 106, is formed within the interconnection channel 107.

The upper interconnect layer 113 includes: a Ti film 108 covering the inner side faces and bottom of the through hole 106 and interconnection channel 107; a TiN film 109 deposited on the Ti film 108; a TiSiN film 110 deposited on the TiN film 109; a Cu film 111 deposited over the TiSiN film 110; and another Cu film 112 deposited on the Cu film 111. And a copper silicide (Cu$_3$Si) film 125 is further formed in the interface between the TiSiN film 110 and Cu film 111.

In this embodiment, the TiN film 109 will be regarded as including vertical portions 109a and horizontal portions 109b if necessary. The vertical portions 109a are formed on the inner sidewalls of the through hole 106 and interconnection channel 107, i.e., on respective planes substantially vertical to the surface of the semiconductor substrate 101. On the other hand, the horizontal portions 109b are formed on the bottoms of the through hole 106 and interconnection channel 107, i.e., on respective planes substantially parallel to the surface of the semiconductor substrate 101. In the same way, the TiSiN film 110 will also be regarded as including vertical portions 110a and horizontal portions 110b if necessary. The vertical portions 110a are formed on the inner sidewalls of the through hole 106 and interconnection channel 107, i.e., on respective planes substantially vertical to the surface of the semiconductor substrate 101. On the other hand, the horizontal portions 110b are formed on the bottoms of the through hole 106 and interconnection channel 107, i.e., on respective planes substantially parallel to the surface of the semiconductor substrate 101.

In such a structure, the leakage current flowing between the through holes 106 and between adjacent portions of the upper interconnect layer 113 can be reduced as compared with the prior art. In addition, the resistance of the through hole 106 and upper interconnect layer 113 against electromigration can be improved. This is because the Cu$_3$Si film 125 formed in the interface between the TiSiN film 110 and Cu film 111 can improve the adhesion between the TiSiN film 110 and Cu film 111, and therefore Cu atoms are less likely to move.

Hereinafter, a method for fabricating this semiconductor device will be described with reference to the accompanying drawings.

Figure 31:
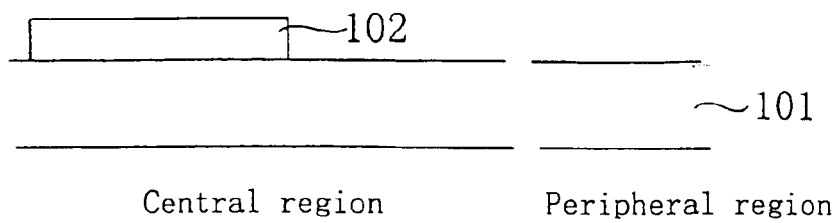
FIG. 31 is a cross-sectional view illustrating a third embodiment of a method for fabricating a semiconductor device according to the present invention.
Figure 32:
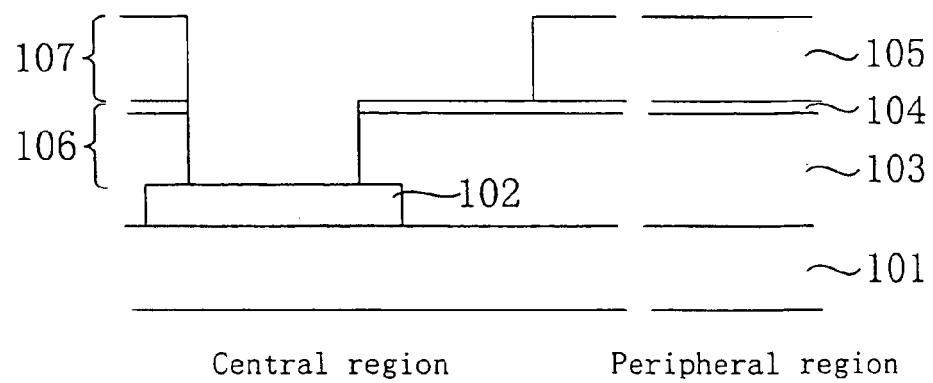
FIG. 32 is a cross-sectional view illustrating the third embodiment of the method for fabricating a semiconductor device according to the present invention.
Figure 33:
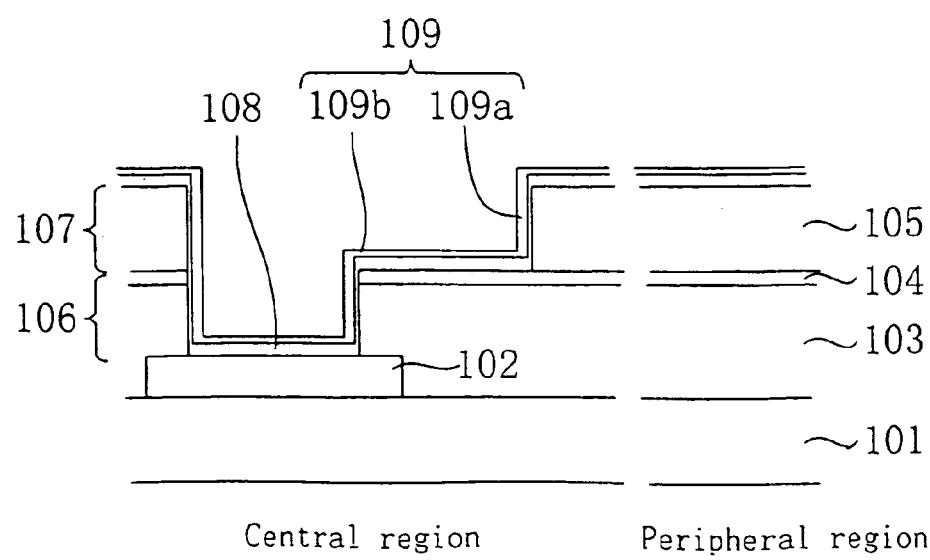
FIG. 33 is a cross-sectional view illustrating the third embodiment of the method for fabricating a semiconductor device according to the present invention.
Figure 34:
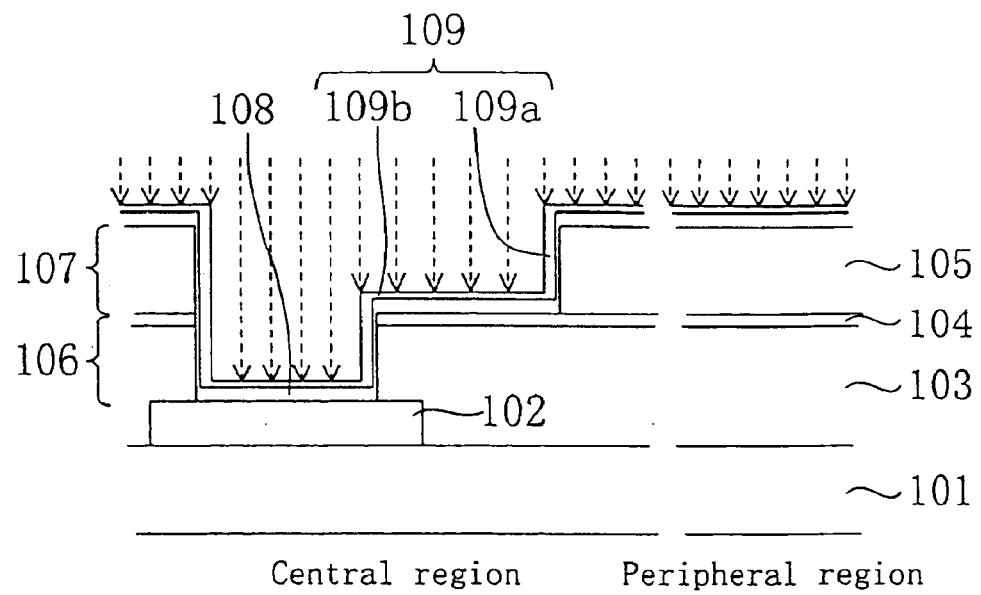
FIG. 34 is a cross-sectional view illustrating the third embodiment of the method for fabricating a semiconductor device according to the present invention.

First, as shown in FIG. 31, the lower interconnect layer 102 is formed on the surface of the semiconductor substrate 101. Next, as shown in FIG. 32, the SiO$_2$ film (thickness: about 100 nm to about 2,000 nm) 103, Si$_3$N$_4$ film (thickness: about 5 nm to about 50 nm) 104 and SiO$_2$ film (thickness: about 100 nm to about 1,000 nm) 105 are deposited in this order. Then, these films are alternately subjected to photolithography and dry etching twice, thereby forming the through hole 106 inside the SiO$_2$ film 103 and Si$_3$N$_4$ film 104 and the interconnection channel 107 inside the SiO$_2$ film 105. Next, as shown in FIG. 33, the bottom of the through hole 106 is cleaned by dry etching. Then, the Ti film (thickness: about 0.5 nm to about 10 nm) 108 is deposited by a PVD process and the TiN film 109 is deposited by a CVD process. Subsequently, as shown in FIG. 34, the surface of the TiN film 109 is exposed to $N_2$ plasma. In this case, the TiN film 109b deposited on the plane parallel to the surface of the semiconductor substrate 101 receives the impact of ion collision effectively. As a result, the density of the TiN film 109b increases. On the other hand, since the TiN film 109a deposited on the planes substantially vertical to the surface of the semiconductor substrate 101 hardly receives the impact of ion collision, the density thereof does not change.

Figure 35:
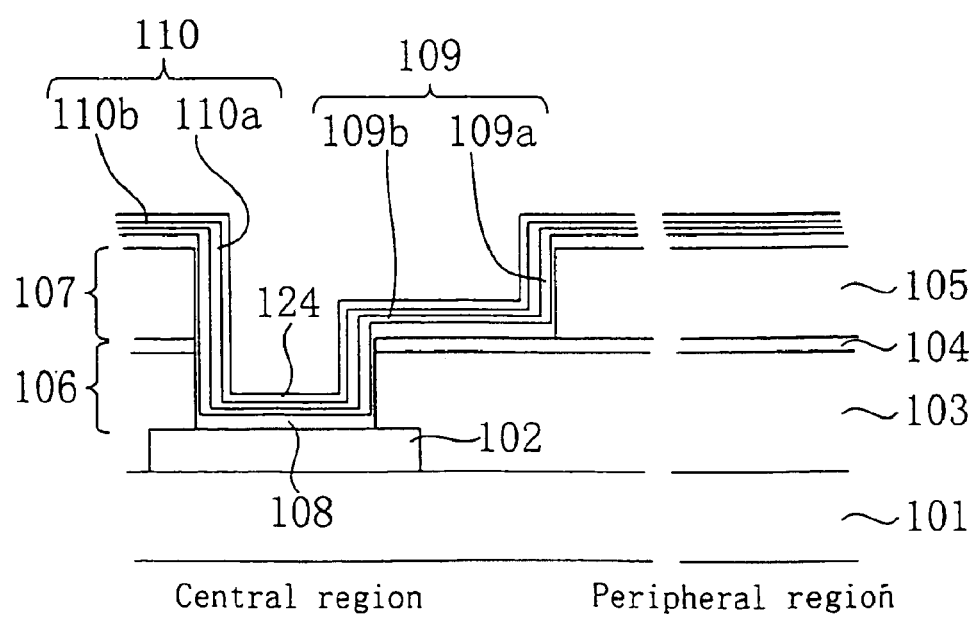
FIG. 35 is a cross-sectional view illustrating the third embodiment of the method for fabricating a semiconductor device according to the present invention.

Then, as shown in FIG. 35, the surface of the TiN film 109 is exposed to $SiH_4$ gas. In this process step, if the semiconductor substrate 101 is heated up to 300° C. or more and the surface of the TiN film 109 is exposed to the $SiH_4$ gas for 15 seconds or more, then the TiSiN films 110a and 110b are formed on the respective surfaces of the TiN films 109a and 109b. Also, at this point in time, an Si film (thickness: about 1 to about 10 nm) 124 is grown on the surface of the TiSiN film 110.

Figure 36:
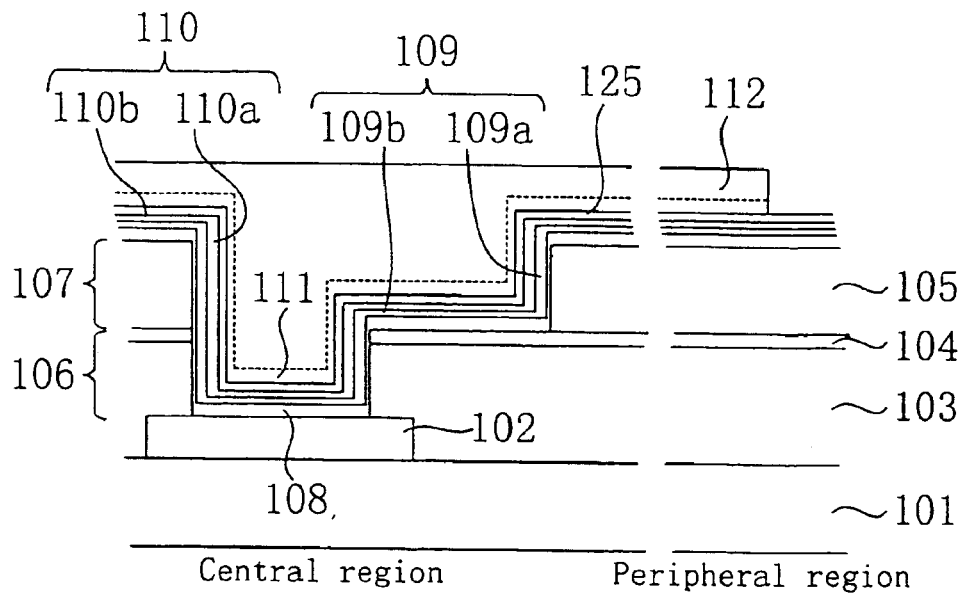
FIG. 36 is a cross-sectional view illustrating the third embodiment of the method for fabricating a semiconductor device according to the present invention.

Thereafter, the Cu film (thickness: about 5 nm to about 200 nm) 111 is deposited on the surface of the Si film 124 by a PVD process. However, the Cu film 111 is deposited only in the central region of the semiconductor substrate 101. The Si film 124 and the Cu film 111 immediately react with each other to form the $Cu_3Si$ film 125 as shown in FIG. 36. After the surfaces of the Cu film 111 and $CU_3Si$ film 125 have been cleaned with $H_2SO_4$, the Cu film (thickness: about 100 nm to about 1,000 nm) 112 is deposited by an electroplating technique. In this process step, the Cu film 112 does not grow on the exposed surface region of the Si film 124. This is because a highly insulating $SiO_2$ film has been formed on the exposed surface of the Si film 124 during the transportation in the air and no ions are reduced in that part.

Finally, respective portions of the Ti film 108, TiN film 109, TiSiN film 110, $Cu_3Si$ film 125 and Cu films 111 and 112, which are deposited on the $SiO_2$ film 105, are removed by a CMP technique to complete the semiconductor device shown in FIG. 37.

Figure 38:
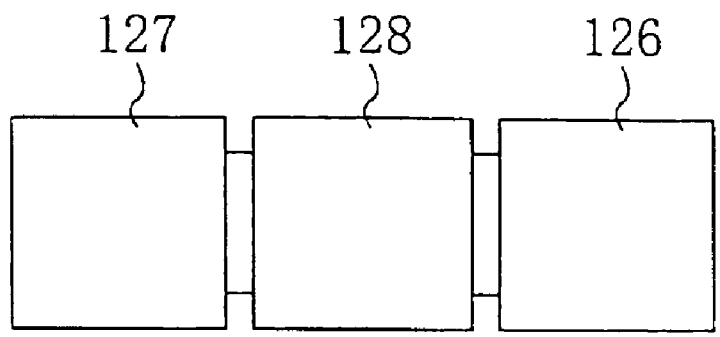
FIG. 38 illustrates an exemplary arrangement for an apparatus for fabricating the semiconductor device according to the present invention.

In this embodiment, the Si film 124 and Cu film 111 are preferably deposited continuously within vacuum. This is because if the Si film 124 is exposed to the air before the Cu film 111 is deposited, then an $SiO_2$ film is unintentionally formed on the surface of the Si film 124 to interfere with the reaction between the Si film 124 and Cu film 111. Such a continuous film deposition is realized using an apparatus for fabricating a semiconductor device with such an arrangement as that shown in FIG. 38. The apparatus shown in FIG. 38 includes: a chemical vapor deposition (CVD) chamber 126 with the construction shown in FIG. 14, for example; and a copper deposition chamber 127 connected to the CVD chamber 126. And these chambers 126 and 127 are linked together via a reduced pressure transport chamber 128.

Embodiment 4

Next, a fourth exemplary embodiment of the present invention will be described with reference to FIGS. 40, 41, 42, 43, 44 and 45. In FIGS. 40 through 45, the same components as those illustrated in FIGS. 1 through 7 are identified by the same reference numerals, and the detailed description thereof will be omitted herein.

Figure 45:
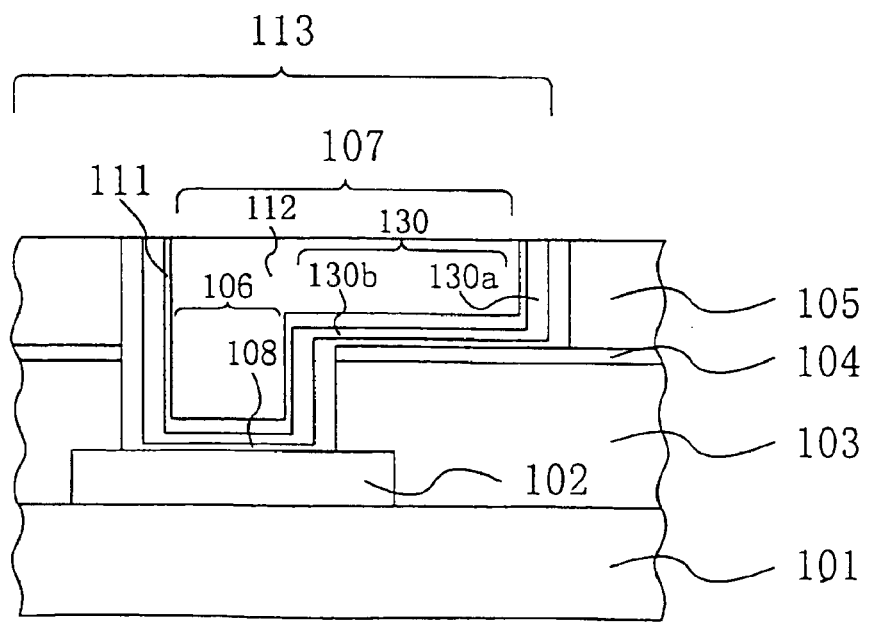
FIG. 45 is a cross-sectional view illustrating a fourth embodiment of a semiconductor device according to the present invention.

As shown in FIG. 45, the semiconductor device of the fourth embodiment includes: a semiconductor substrate 101; a lower interconnect layer 102; and an $SiO_2$ film 103. On the semiconductor substrate 101, integrated circuit devices such as transistors are formed although not shown in FIG. 45. The lower interconnect layer 102 is formed on the surface of the semiconductor substrate 101. And the $SiO_2$ film 103 is deposited on the semiconductor substrate 101 to cover the lower interconnect layer 102.

An $Si_3N_4$ film 104 is deposited over the $SiO_2$ film 103, and another $SiO_2$ film 105 is deposited on the $Si_3N_4$ film 104. An interlevel dielectric film is made up of the $SiO_2$ film 103, $Si_3N_4$ film 104 and $SiO_2$ film 105. In the interlevel dielectric film, an opening is formed. The opening includes: a through hole 106 reaching the lower interconnect layer 102; and an interconnection channel 107 communicating with the through hole 106. An upper interconnect layer 113, which is in electrical contact with the lower interconnect layer 102 via the through hole 106, is formed within the interconnection channel 107.

The upper interconnect layer 113 includes: a Ti film 108 covering the inner sidewalls and bottom of the through hole 106 and interconnection channel 107; a tantalum nitride (TaN) film 130 formed on surface of the Ti film 108; a Cu film 111 deposited on the TaN film 130; and another Cu film 112 deposited on the Cu film 111.

In this embodiment, the TaN film 130 will be regarded as including vertical portions 130a and horizontal portions 130b if necessary. The vertical portions 130a are formed on the inner sidewalls of the through hole 106 and interconnection channel 107, i.e., on respective planes substantially vertical to the surface of the semiconductor substrate 101. On the other hand, the horizontal portions 130b are formed on the bottoms of the through hole 106 and interconnection channel 107, i.e., on respective planes substantially parallel to the surface of the semiconductor substrate 101. The concentration of carbon in the horizontal portions 130b of the TaN film 130 is lower than that in the vertical portions 130a thereof.

In this structure, the connection resistance between the lower and upper interconnect layers 102 and 113 can be lower than that of a conventional structure. The reason is as follows.

The connection resistance between the lower and upper interconnect layers 102 and 113 is essentially determined depending on the resistivity of the TaN film 130 deposited over the bottom of the through hole 106. In this embodiment, the horizontal portion 130b of the TaN film 130 exists over the bottom of the through hole 106, while the vertical portions 130a of the TaN film 130 exist over the sidewall of the through hole 106. And the concentration of C in the horizontal portion 130b is lower than that of C in the vertical portions 130a. The lower the concentration of C in a TaN film, the lower the resistivity of the TaN film. Accordingly, by lowering the concentration of C in the horizontal portion 130b of the TaN film 130, the connection resistance between the lower and upper interconnect layers 102 and 113 can be reduced as compared with the prior art.

Hereinafter, a method for fabricating this semiconductor device will be described with reference to the accompanying drawings.

Figure 40:
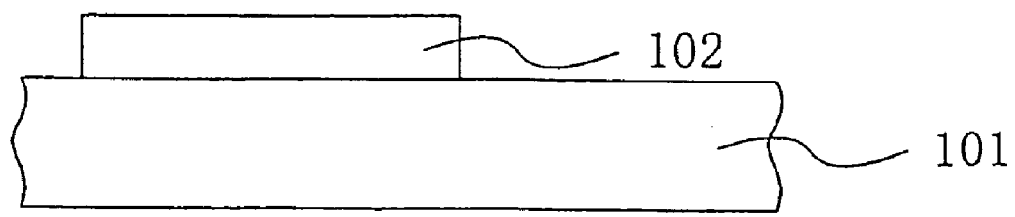
FIG. 40 is a cross-sectional view illustrating a fourth embodiment of a method for fabricating a semiconductor device according to the present invention.

First, as shown in FIG. 40, the lower interconnect layer 102 is formed on the surface of the semiconductor substrate 101.

Figure 41:
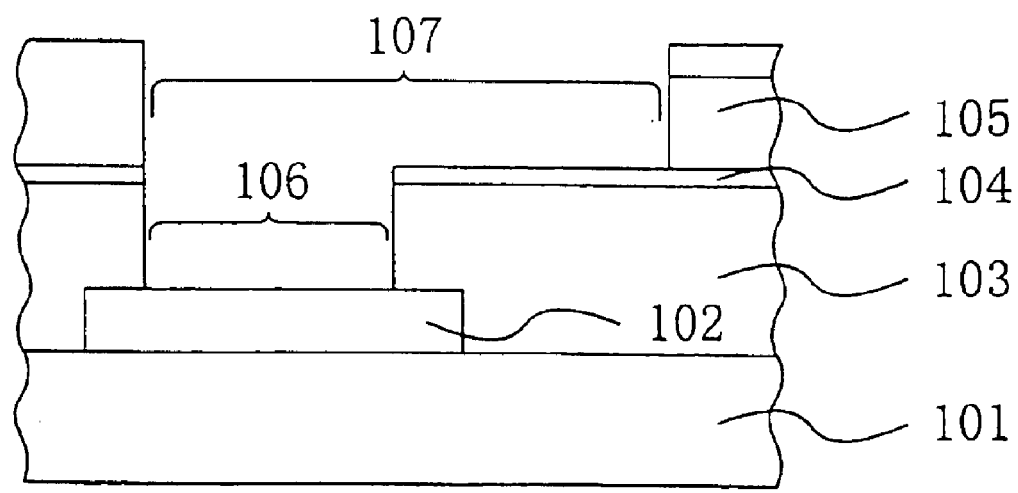
FIG. 41 is a cross-sectional view illustrating the fourth embodiment of the method for fabricating a semiconductor device according to the present invention.

Next, as shown in FIG. 41, the $SiO_2$ film (thickness: about 100 nm to about 2,000 nm) 103, $Si_3N_4$ film (thickness: about 5 nm to about 50 nm) 104 and $SiO_2$ film (thickness: about 100 nm to about 1,000 nm) 105 are deposited in this order. Then, these films are alternately subjected to photolithography and dry etching twice, thereby forming the through hole 106 inside the $SiO_2$ film 103 and $Si_3N_4$ film 104 and the interconnection channel 107 inside the $SiO_2$ film 105.

Figure 42:
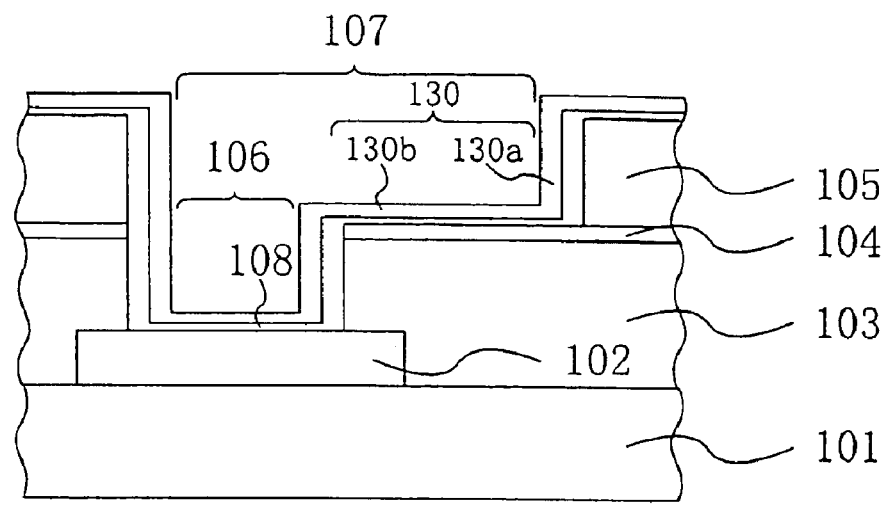
FIG. 42 is a cross-sectional view illustrating the fourth embodiment of the method for fabricating a semiconductor device according to the present invention.

Next, as shown in FIG. 42, the bottom of the through hole 106 is cleaned by dry etching. Thereafter, the Ti film (thickness: about 0.5 nm to about 10 nm) 108 is deposited by a PVD process and then the TaN film 130 is deposited to be about 20 nm thick by a CVD process. The CVD deposition of the TaN film 130 may be performed in the following manner. The semiconductor substrate 101, on which the Ti film 108 has already been deposited, is heated up to 400° C. within a vacuum chamber. At a point in time the semiconductor substrate 101 reaches its steady temperature, pentakisdimethylamide tantalum (Ta(NMe$_2$)$_5$) is introduced into the vacuum chamber, along with ammonium (NH$_3$). The Ta(NMe$_2$)$_5$ and NH$_3$ introduced react with each other on the surface of the Ti film 108, whereby the TaN film 130 is deposited thereon.

Figure 43:
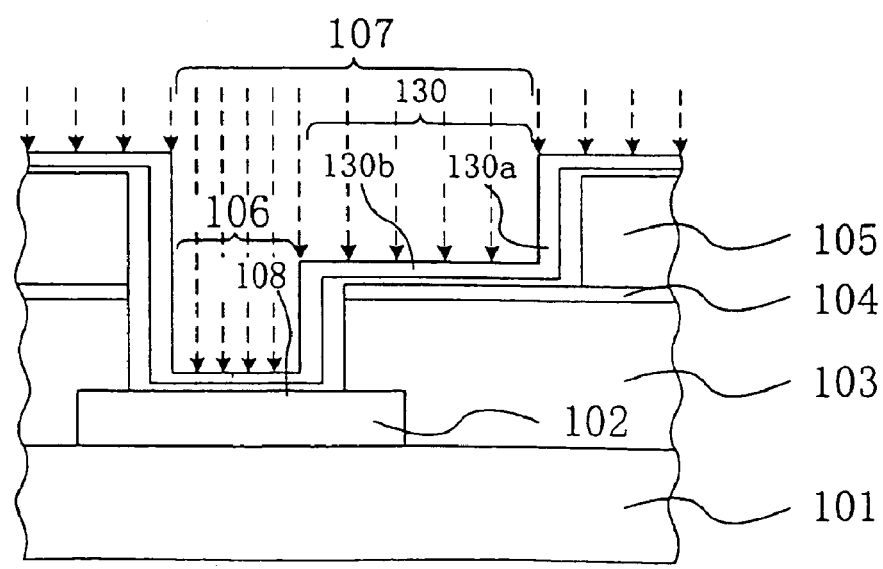
FIG. 43 is a cross-sectional view illustrating the fourth embodiment of the method for fabricating a semiconductor device according to the present invention.

Subsequently, as shown in FIG. 43, the surface of the TaN film 130 is exposed to plasma generated within ammonium (NH$_3$). In this plasma, positive ions such as NH$_2$ ions are contained. The plasma is generated under the conditions controlled to vertically accelerate these positive ions toward the semiconductor substrate 101. Accordingly, the TaN film 130b deposited on the plane parallel to the surface of the semiconductor substrate 101 receives the impact of ion collision. As a result, the density of the TaN film 130b increases, and C contained in the TaN film 130b dissociates itself into the vapor. On the other hand, since the vertical portion 130a of the TaN film 130 deposited on the planes substantially vertical to the surface of the semiconductor substrate 101 do not receive the impact of ion collision, the density thereof does not increase. As a result, the TaN film 130b becomes thinner than the TaN film 130a, and the concentration of C in the TaN film 130b becomes lower than that in the TaN film 130a. The plasma exposure may be carried out using a parallel plate plasma generator, for example, under the conditions that in-chamber pressure of the NH$_3$ gas is in the range from about 10 Pa to about 1,000 Pa and power applied is from about 200 W to about 2,000 W.

Figure 44:
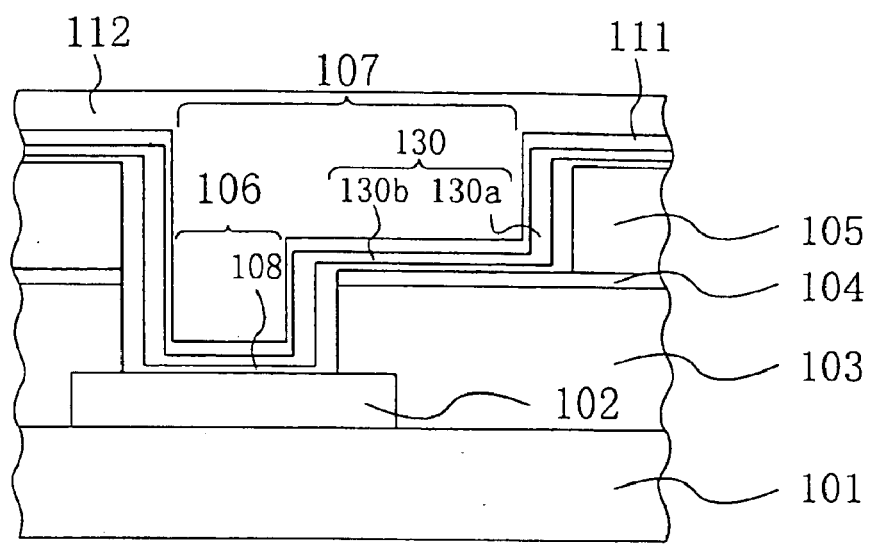
FIG. 44 is a cross-sectional view illustrating the fourth embodiment of the method for fabricating a semiconductor device according to the present invention.

Thereafter, as shown in FIG. 44, the Cu film 111 is deposited by a PVD process on the surface of the TaN film 130. Then, the surface of the Cu film 111 is cleaned with H$_2$SO$_4$, and the Cu film 112 is deposited on the surface of the Cu film 111 by an electroplating technique.

Finally, respective portions of the Ti film 108, TaN film 130 and Cu films 111 and 112, which are deposited on the SiO$_2$ film 105, are removed by a CMP technique to complete the semiconductor device shown in FIG. 45.

Embodiment 5

Next, a fifth exemplary embodiment of the present invention will be described with reference to FIGS. 46, 47, 48, 49, 50, 51 and 52. In FIGS. 46 through 52, the same components as those illustrated in FIGS. 40 through 45 are identified by the same reference numerals, and the detailed description thereof will be omitted herein.

Figure 52:
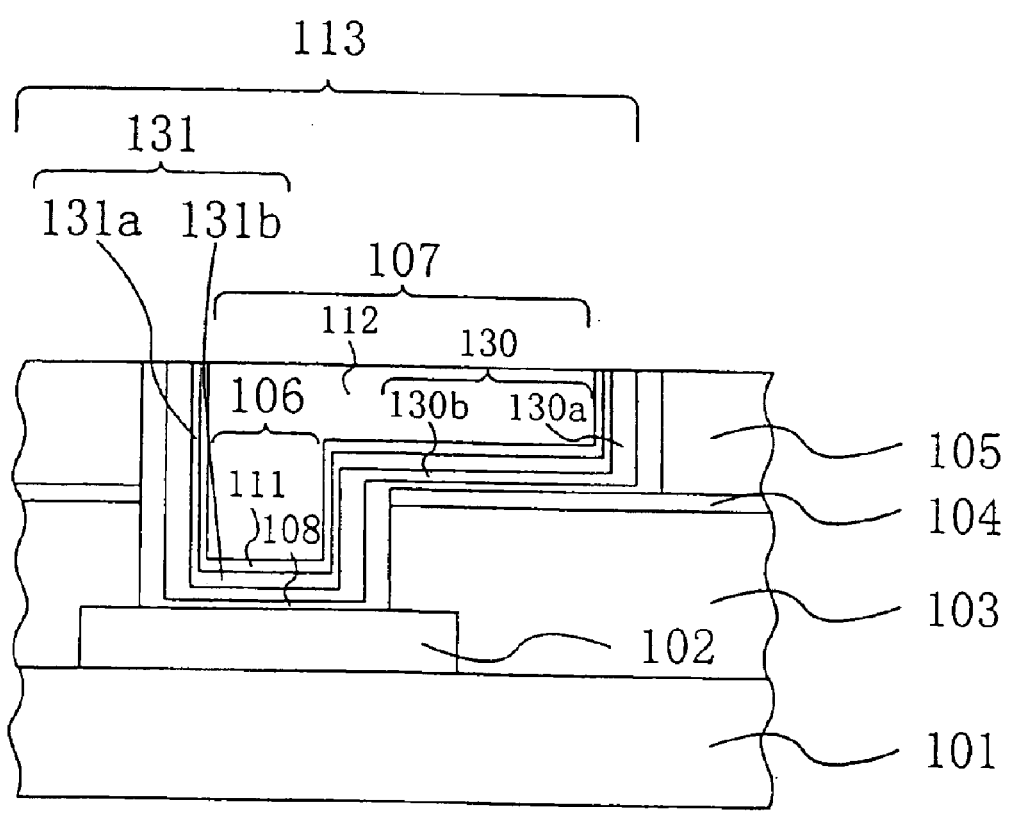
FIG. 52 is a cross-sectional view illustrating a fifth embodiment of a semiconductor device according to the present invention.

As shown in FIG. 52, the semiconductor device of the fifth embodiment includes: a semiconductor substrate 101; a lower interconnect layer 102; and an SiO$_2$ film 103. On the semiconductor substrate 101, integrated circuit devices such as transistors are formed although not shown in FIG. 52. The lower interconnect layer 102 is formed on the surface of the semiconductor substrate 101. And the SiO$_2$ film 103 is deposited on the semiconductor substrate 101 to cover the lower interconnect layer 102.

An Si$_3$N$_4$ film 104 is deposited over the SiO$_2$ film 103, and another SiO$_2$ film 105 is deposited on the Si$_3$N$_4$ film 104. An interlevel dielectric film is made up of the SiO$_2$ film 103, Si$_3$N$_4$ film 104 and SiO$_2$ film 105. In the interlevel dielectric film, an opening is formed. The opening includes a through hole 106 reaching the lower interconnect layer 102, and an interconnection channel 107 communicating with the through hole 106. An upper interconnect layer 113, which is in electrical contact with the lower interconnect layer 102 via the through hole 106, is formed within the interconnection channel 107.

The upper interconnect layer 113 includes: a Ti film 108 covering the inner sidewalls and bottom of the through hole 106 and interconnection channel 107; a TaN film 130 deposited on the surface of the Ti film 108; a tantalum nitride silicide (TaSiN) film 131 formed on the TaN film 130; a Cu film 111 formed on the TaSiN film 131; and another Cu film 112 deposited on the Cu film 111.

In this embodiment, the TaN film 130 will be regarded as including vertical portions 130a and horizontal portions 130b if necessary. The vertical portions 130a are formed on the inner sidewalls of the through hole 106 and interconnection channel 107, i.e., on respective planes substantially vertical to the surface of the semiconductor substrate 101. On the other hand, the horizontal portions 130b are formed on the bottoms of the through hole 106 and interconnection channel 107, i.e., on respective planes substantially parallel to the surface of the semiconductor substrate 101. Similarly, the TaSiN film 131 will also be regarded as including vertical portions 131a and horizontal portions 131b if necessary. The vertical portions 131a are formed on the inner sidewalls of the through hole 106 and interconnection channel 107, i.e., on respective planes substantially vertical to the surface of the semiconductor substrate 101. On the other hand, the horizontal portions 131b are formed on the bottoms of the through hole 106 and interconnection channel 107, i.e., on respective planes substantially parallel to the surface of the semiconductor substrate 101.

The structure of the semiconductor device of the fifth embodiment is different from that of the semiconductor device of the fourth embodiment in that the TaSiN film 131 is additionally formed on the surface of the TaN film 130 as shown in FIG. 52. The ability of the TaSiN film 131 to prevent the diffusion of Cu atoms is higher than that of the TaN film 130. Accordingly, by adopting the structure of the fifth embodiment, the leakage current flowing between the through holes 106 and between adjacent portions of the upper interconnect layer 113 can be further reduced than the fourth embodiment.

Next, the thickness of the TaSiN film 131b will be described. The resistivity of the TaSiN film 131b is higher than that of the TaN film 130b that has been exposed to NH$_3$ plasma. Thus, if the TaSiN film 131b is too thick, then the connection resistance between the lower and upper interconnect layers 102 and 113 increases, thus decreasing the operating speed of the semiconductor device. This is why the TaSiN film 131b is preferably thinner than the TaSiN film 131a.

Hereinafter, a method for fabricating this semiconductor device will be described with reference to the accompanying drawings.

Figure 46:
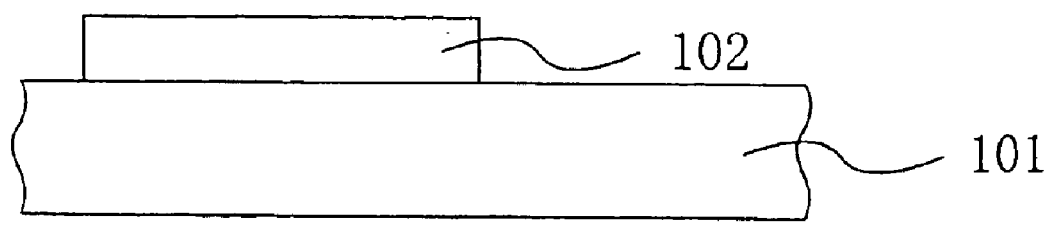
FIG. 46 is a cross-sectional view illustrating a fifth embodiment of a method for fabricating a semiconductor device according to the present invention.

First, as shown in FIG. 46, the lower interconnect layer 102 is formed on the surface of the semiconductor substrate 101.

Figure 47:
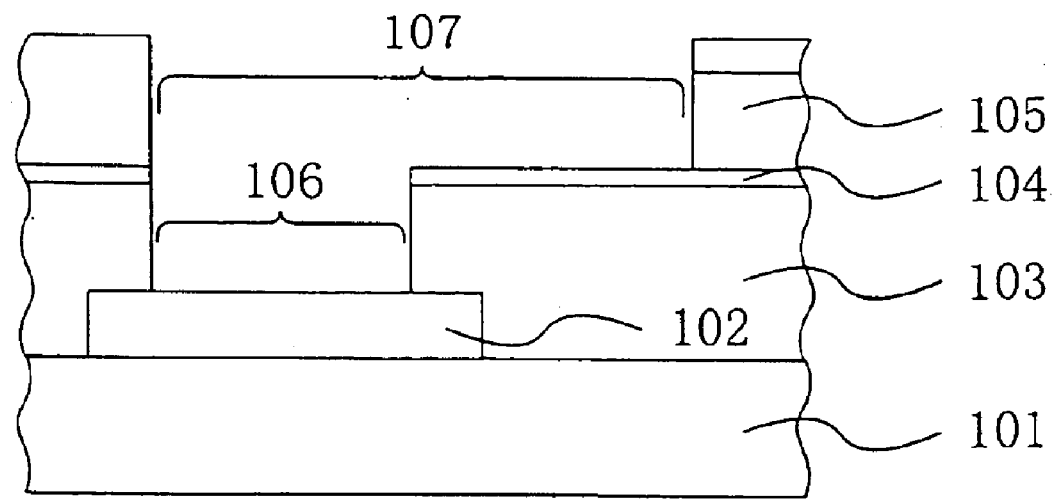
FIG. 47 is a cross-sectional view illustrating the fifth embodiment of the method for fabricating a semiconductor device according to the present invention.

Next, as shown in FIG. 47, the SiO$_2$ film (thickness: about 100 nm to about 2,000 nm) 103, Si$_3$N$_4$ film (thickness: about 5 nm to about 50 nm) 104 and SiO$_2$ film (thickness: about 100 nm to about 1,000 nm) 105 are deposited in this order. Then, these films are alternately subjected to photolithography and dry etching twice, thereby forming the through hole 106 inside the SiO$_2$ film 103 and Si$_3$N$_4$ film 104 and the interconnection channel 107 inside the SiO$_2$ film 105.

Figure 48:
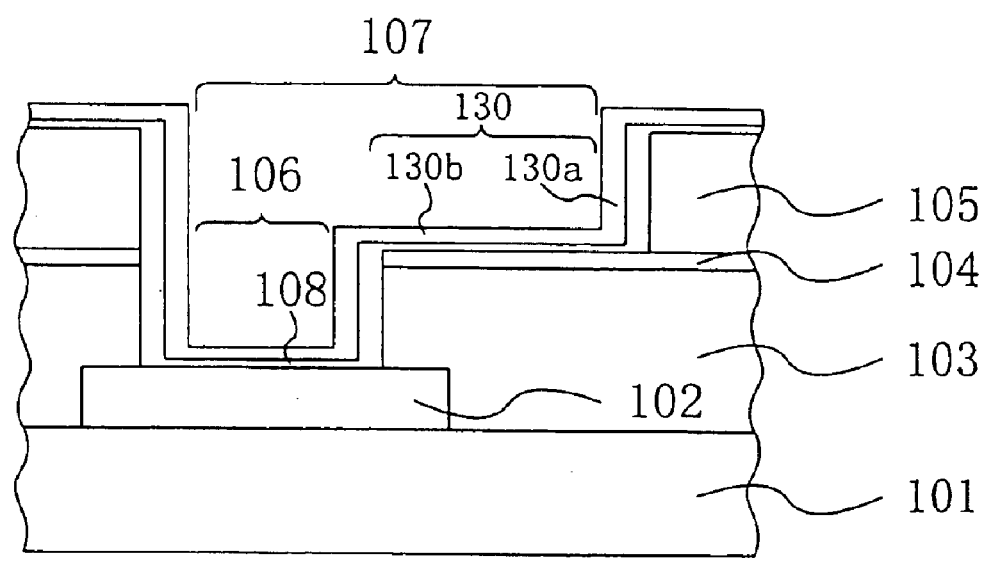
FIG. 48 is a cross-sectional view illustrating the fifth embodiment of the method for fabricating a semiconductor device according to the present invention.

Next, as shown in FIG. 48, the bottom of the through hole 106 is cleaned by dry etching. Thereafter, the Ti film 108 is deposited by a PVD process and then the TaN film 130 (thickness: about 1 nm to about 50 nm) is deposited by a CVD process.

Figure 49:
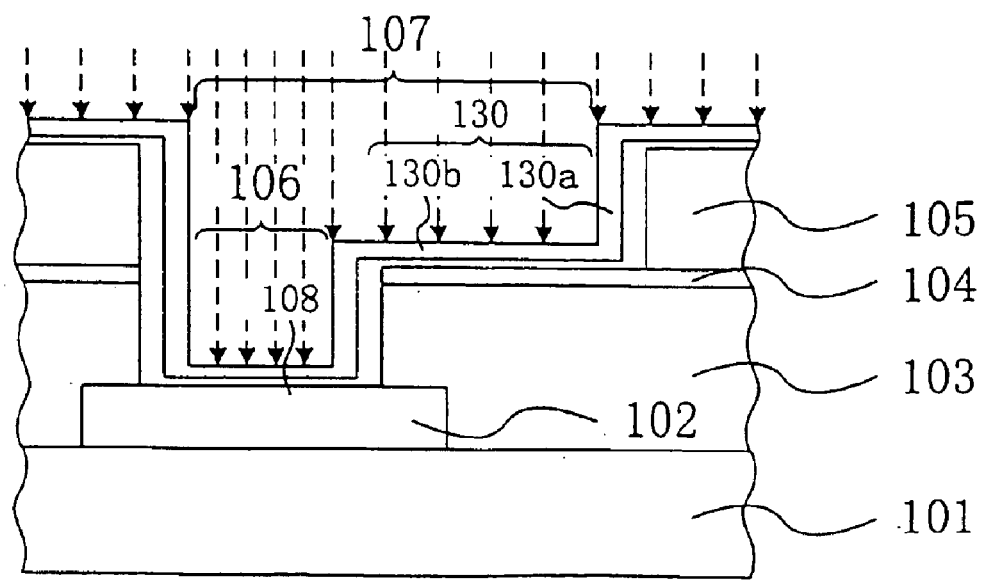
FIG. 49 is a cross-sectional view illustrating the fifth embodiment of the method for fabricating a semiconductor device according to the present invention.

Subsequently, as shown in FIG. 49, the surface of the TaN film 130 is exposed to $NH_3$ plasma. As a result, the TaN film 130b deposited on the plane parallel to the surface of the semiconductor substrate 101 receives the impact of ion collision. Accordingly, the density of the TaN film 130b increases, and C contained in the TaN film 130b dissociates itself into the vapor. On the other hand, since the vertical portions 130a of the TaN film 130 deposited on the planes substantially vertical to the surface of the semiconductor substrate 101 do not receive the impact of ion collision, the density thereof does not increase. As a result, the TaN film 130b becomes thinner than the TaN film 130a, and the concentration of carbon in the TaN film 130b becomes lower than that in the TaN film 130a.

Figure 50:
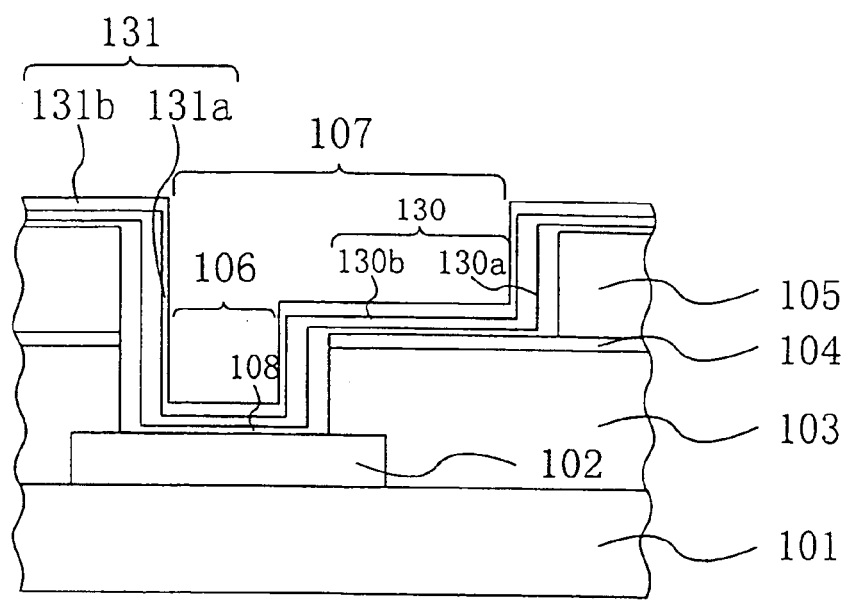
FIG. 50 is a cross-sectional view illustrating the fifth embodiment of the method for fabricating a semiconductor device according to the present invention.

Next, as shown in FIG. 50, the surface of the TaN film 130 is exposed to disilane ($Si_2H_6$). This process is performed with the semiconductor substrate 101, which has already been exposed to the $NH_3$ plasma, heated up to 400° C. within the vacuum chamber and with $Si_2H_6$ introduced into the vacuum chamber. As a result, the TaSiN films 131a and 131b are formed on the TaN films 130a and 130b, respectively. The TaSiN film 131b becomes thinner than the TaSiN film 131a. This is because $Si_2H_6$ is less likely to diffuse into the TaN film 130b that has its density increased through the exposure to the $NH_3$ plasma.

Figure 51:
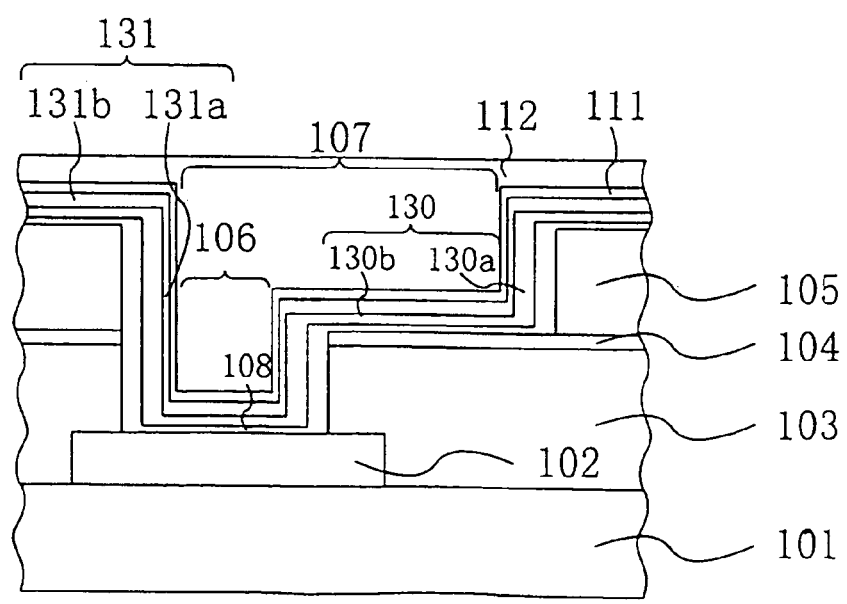
FIG. 51 is a cross-sectional view illustrating the fifth embodiment of the method for fabricating a semiconductor device according to the present invention.

Thereafter, as shown in FIG. 51, the Cu film (thickness: about 5 to about 200 nm) 111 is deposited by a PVD process on the surface of the TaSiN film 131. Then, the surface of the Cu film 111 is cleaned with $H_2SO_4$, and the Cu film 112 is deposited on the surface of the Cu film 111 by an electroplating technique.

Finally, respective portions of the Ti film 108, TaN film 130, TaSiN film 131 and Cu films 111 and 112, which are deposited on the $SiO_2$ film 105, are removed by a CMP technique to complete the semiconductor device shown in FIG. 52.

Figure 14:
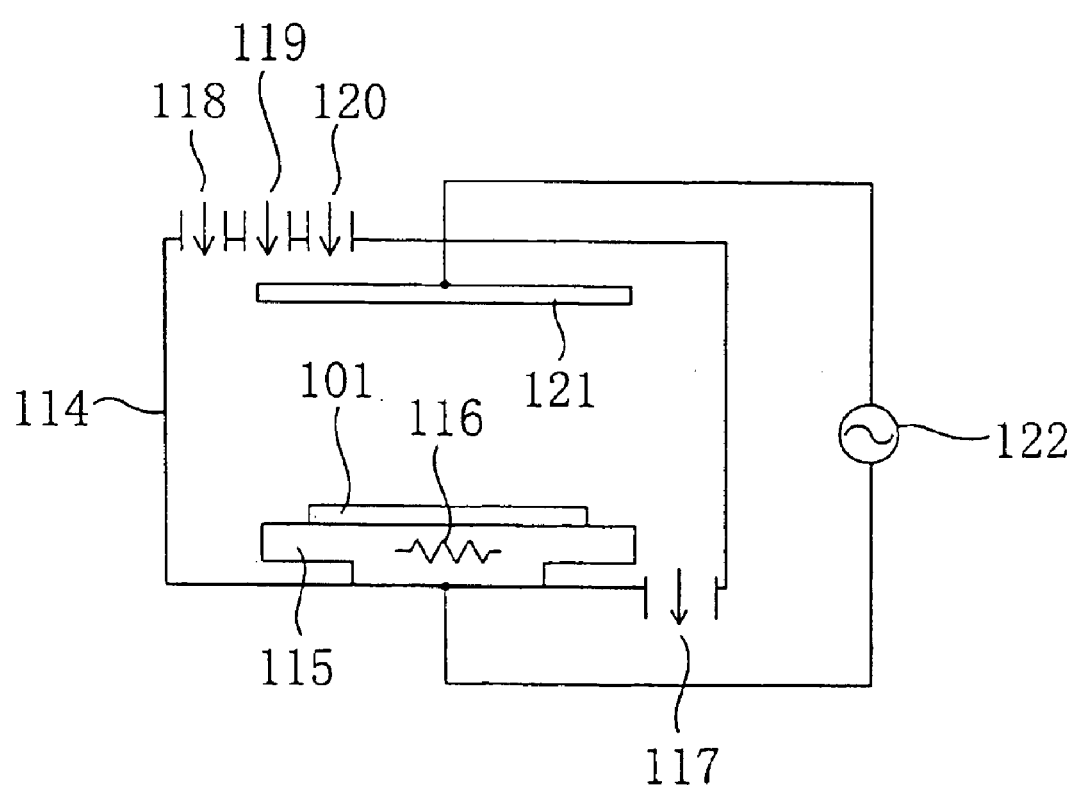
FIG. 14 is a cross-sectional view illustrating an embodiment of an apparatus for fabricating a semiconductor device according to the present invention.

The semiconductor device of the fifth embodiment may be fabricated by using the apparatus shown in FIG. 14. In this embodiment, however, Ta(NMe$_2$)$_5$, $NH_3$ and $Si_2H_6$ gases are introduced through the inlet ports 118, 119 and 120 of the vacuum chamber 114.

This apparatus for fabricating a semiconductor device operates as follows. First, the inside of the vacuum chamber 114 is opened to the air, and the semiconductor substrate 101, on which the Ti film 108 has already been deposited, is placed on the susceptor 115. Then, the vacuum chamber 114 is evacuated through the exhaust port 117. After the evacuation is over, the heating mechanism 116 is activated, thereby heating the semiconductor substrate 101 through the susceptor 115. The output of the heating mechanism 116 is adjusted at such a value that the steady temperature of the semiconductor substrate 101 becomes 400° C. When the temperature of the semiconductor substrate 101 reaches its steady temperature, Ta(NMe$_2$)$_5$ and $NH_3$ gases are introduced through the inlet ports 118 and 119, respectively. As a result, Ta(NMe$_2$)$_5$ reacts with $NH_3$ on the surface of the Ti film 108 to deposit the TaN film 130 thereon. After a predetermined time has passed, the supply of Ta(NMe$_2$)$_5$ is stopped. When the partial pressure of Ta(NMe$_2$)$_5$ residual inside the vacuum chamber 114 reaches a sufficiently small value, power is applied from the radio frequency power supply 122 to the susceptor 115 and the upper electrode 121, thereby generating $NH_3$ plasma inside the vacuum chamber 114. As a result, the TaN film 130b deposited on a plane parallel to the surface of the semiconductor substrate 101 receives the impact of ion collision and the density thereof increases. After a predetermined time has passed, the radio frequency power supply 122 is stopped and the supply of $NH_3$ is suspended. Then, $Si_2H_6$ is introduced through the inlet port 120. As a result, the TaSiN film 131 is formed on the surface of the TaN film 130. Finally, the operation of the heating mechanism 116 is stopped, the vacuum chamber 114 is opened to the air and then the semiconductor substrate 101 is ejected.

The present invention has been described by way of five illustrative embodiments. However, the present invention is in no way limited to these embodiments.

For example, in the foregoing embodiments, a so-called "dual damascene" process, in which both the through hole 106 and interconnection channel 107 are formed continuously and then filled in with a metal such as the Cu film 112, is employed. Alternatively, a "single damascene" process, in which either the through hole 106 or interconnection channel 107 is formed and then filled in with a metal such as the Cu film 112, may also be employed.

Also, in the foregoing embodiments, $SiO_2$ and $Si_3N_4$ are used as materials for insulating upper and lower interconnect layers from each other. If necessary, any other appropriate materials may be used instead. Examples of such materials include $SiO_2$ containing an impurity such as fluorine (F), and an organic compound with insulating properties.

Moreover, in the foregoing embodiments, the Ti film 108 is deposited on the surface of the $SiO_2$ film 105 and inside the through hole 106. However, depending on the type of a conductor material for the lower interconnect layer 102, the Ti film 108 need not be deposited.

Figure 39:
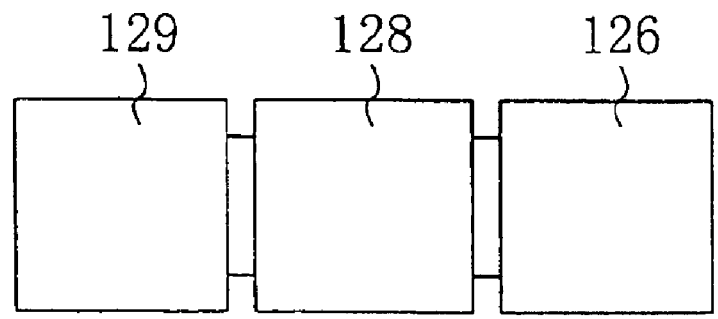
FIG. 39 illustrates an exemplary arrangement for another apparatus for fabricating the semiconductor device according to the present invention.

Nevertheless, if the through hole 106 and interconnection channel 107 are filled in with copper, the Ti film 108 is preferably deposited. This is because the Ti film 108 can contribute to aligning the crystallographic orientations of the copper filled, thus increasing the resistance against electromigration. In this case, the Ti film 108 and the TiN film 109, TiSiN film 123 or TaN film 130 are preferably deposited continuously within vacuum. Such a continuous film deposition is realized using an apparatus for fabricating a semiconductor device such as that shown in FIG. 39. The apparatus shown in FIG. 39 includes a titanium deposition chamber 129 connected to the CVD chamber 126. And these chambers 126 and 129 are linked together via a reduced pressure transport chamber 128. Alternatively, the CVD chamber 126 may be linked together with both the copper and titanium deposition chambers 127, 129 via the reduced pressure transport chamber 128 although not shown in FIG. 39.

Furthermore, in the second embodiment, TDMAT is used as a source material for the TiN film 109 and TiSiN film 123. Alternatively, any other titanium-containing organic compound may also be used. Examples of such compounds include tetrakisdiethyl titanium (TDEAT) and tetrakisethylmethyl titanium (TEMAT).

In the fourth and fifth embodiments, tantalum nitride is used as a metal for preventing the diffusion of Cu atoms. Optionally, any other metal nitride may be used. Examples of such metal nitrides include tungsten nitride (WN) and molybdenum nitride (MoN). WN may be synthesized by using, instead of Ta(NMe$_2$)$_5$, an amino complex or imide complex of tungsten as a source material. One example of such complexes is bis(tertiarybutylimide)-bis (tertiarybutylamide) tungsten. MoN may be synthesized by using, instead of Ta(NMe$_2$)$_5$, an amino complex or imide complex of molybdenum as a source material. One example of such complexes is bis(dimethylamide)bis (tertiarybutylimide) molybdenum.

In the second embodiment, the TiN film 109 and the TiSiN film 123 are exposed to plasma generated within N$_2$. Alternatively, any other nitrogen compound may also be used. Examples of such gases include ammonium (NH$_3$) and hydrazine (N$_2$H$_4$).

In the fourth and fifth embodiments, the TaN film 130 is exposed to plasma generated within NH$_3$. Alternatively, any other nitrogen compound may also be used. Examples of such gases include nitrogen (N$_2$) and hydrazine (N$_2$H$_4$).

In the first and second embodiments, SiH$_4$ is used for depositing the TiSiN films 110 and 123. Alternatively, any other appropriate silicide may be used instead. Examples of such compounds include disilane (Si$_2$H$_6$) and trisilane (Si$_3$H$_6$).

In the fourth and fifth embodiments, Si$_2$H$_6$ is used for forming the TaSiN film 131. Alternatively, any other appropriate silicide may be used instead. Examples of such compounds include silane (SiH$_4$) and trisilane (Si$_3$Ha).

Although the Cu film 111 is deposited by a physical vapor deposition process, the Cu film 111 may be deposited by a chemical vapor deposition process, for example.

In the foregoing embodiments, the Cu film 112 is deposited by an electroplating technique. However, any other deposition technique may be used, so long as the through hole 106 and interconnection channel 107 can be filled in. One example of such deposition techniques is an electroless plating technique.

Furthermore, in the foregoing embodiments, a thin film is exposed to a plasma to bombard the thin film with ions. Alternatively, any other technique, like ion implantation, may also be used.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor device comprising:

a substrate;

a first conductor film supported by the substrate;

an insulating film formed on the substrate to cover the first conductor film, an opening being formed in the insulating film; and a second conductor film, which is formed within the opening of the insulating film and is in electrical contact with the first conductor film, wherein the second conductor film includes:

a silicon-containing titanium nitride layer formed within the opening;

a metal layer formed over the silicon-containing titanium nitride layer, a concentration of silicon in a portion of the silicon-containing titanium nitride layer, which is formed over the bottom of the opening, is lower than that in another portion of the silicon-containing titanium nitride layer, which is formed over the inner sidewall of the opening; and a silicide metal layer formed in between the silicon-containing titanium nitride layer and the metal layer.

2. A semiconductor device comprising:

a substrate;

a first conductor film supported by the substrate;

an insulating film formed on the substrate to cover the first conductor film, an opening being formed in the insulating film; and a second conductor film, which is formed within the opening and is in electrical contact with the first conductor;

wherein the second conductor film includes:

a metal nitride suicide layer formed within the opening;

a metal layer formed on the metal nitride suicide layer; and a portion of the metal nitride silicide layer, which is formed over the bottom of the opening, is thinner than another portion of the metal nitride silicide layer, which is formed over the inner sidewall of the opening.

3. The device of claim 2, wherein the metal nitride silicide layer is a tantalum nitride silicide layer, a tungsten nitride suicide layer or a molybdenum nitride silicide layer.

4. The device of claim 2, wherein the second conductor film further comprising, a metal nitride layer under the metal nitride silicide layer, and a portion of the metal nitride layer, which is formed over the bottom of the opening, is denser than another portion of the metal nitride layer, which is formed over the inner sidewall of the opening.

5. The device of claim 2, wherein the metal layer is made of copper or a copper alloy.

6. A semiconductor device comprising:

a substrate;

a first conductor film supported by the substrate;

an insulating film formed on the substrate to cover the first conductor film, an opening being formed in the insulating film; and a second conductor film, which is formed within the opening and is in electrical contact with the first conductor film, wherein the second conductor film includes:

a carbon-containing metal nitride layer formed within the opening;

a metal layer formed on the metal nitride layer;

a portion of the metal nitride layer, which is formed over the bottom of the opening, is thinner than the portion of the metal nitride layer, which is formed over the inner sidewall of the opening; and the metal nitride layer is a tantalum nitride layer, a tungsten nitride layer or a molybdenum nitride layer.

7. The device of claim 6, wherein a concentration of carbon in a portion of the metal nitride layer, which is formed over the bottom of the opening, is lower than that in another portion of the metal nitride layer, which is formed over the inner sidewall of the opening.

8. The device of claim 6, wherein a resistance in the portion of the metal nitride layer, which is formed over the bottom of the opening, is lower than that in the portion of the metal nitride layer, which is formed over the inner sidewall of the opening.

9. The device of claim 6, wherein the metal layer is made of copper or a copper alloy.

* * * * *